United States Patent [19]

Inokuti et al.

[11] Patent Number: 4,713,123
[45] Date of Patent: Dec. 15, 1987

[54] METHOD OF PRODUCING EXTRA-LOW IRON LOSS GRAIN ORIENTED SILICON STEEL SHEETS

[75] Inventors: Yukio Inokuti; Yoh Ito; Toshihiko Funahashi, all of Chiba, Japan

[73] Assignee: Kawasaki Steel Corporation, Kobe, Japan

[21] Appl. No.: 907,734
[22] PCT Filed: Feb. 21, 1986
[86] PCT No.: PCT/JP86/00087
 § 371 Date: Sep. 9, 1986
 § 102(e) Date: Sep. 9, 1986
[87] PCT Pub. No.: WO86/04929
 PCT Pub. Date: Aug. 28, 1986

[30] Foreign Application Priority Data

| Feb. 22, 1985 | [JP] | Japan | 60-32935 |
|---|---|---|---|
| Mar. 5, 1985 | [JP] | Japan | 60-42984 |
| Mar. 5, 1985 | [JP] | Japan | 60-42985 |
| Apr. 8, 1985 | [JP] | Japan | 60-73842 |
| Apr. 10, 1985 | [JP] | Japan | 60-74460 |
| Apr. 10, 1985 | [JP] | Japan | 60-74461 |
| Apr. 10, 1985 | [JP] | Japan | 60-74462 |
| Apr. 22, 1985 | [JP] | Japan | 60-84523 |
| Apr. 22, 1985 | [JP] | Japan | 60-84525 |
| Jul. 23, 1985 | [JP] | Japan | 60-161221 |
| Jul. 23, 1985 | [JP] | Japan | 60-161223 |
| Jul. 23, 1985 | [JP] | Japan | 60-161227 |
| Jul. 23, 1985 | [JP] | Japan | 60-161228 |
| Jul. 23, 1985 | [JP] | Japan | 60-161232 |
| Aug. 16, 1985 | [JP] | Japan | 60-180161 |
| Aug. 16, 1985 | [JP] | Japan | 60-180162 |
| Aug. 16, 1985 | [JP] | Japan | 60-180163 |
| Aug. 16, 1985 | [JP] | Japan | 60-180164 |
| Dec. 17, 1985 | [JP] | Japan | 60-282053 |
| Feb. 6, 1986 | [JP] | Japan | 61-22848 |
| Feb. 18, 1986 | [JP] | Japan | 61-31764 |

[51] Int. Cl.$^4$ ............................................. H01F 1/04
[52] U.S. Cl. ...................................... 148/113; 427/127
[58] Field of Search .................. 148/110, 111, 112, 113; 427/127

[56] References Cited

U.S. PATENT DOCUMENTS

| 3,562,011 | 2/1971 | Hirst et al. | 148/113 |
|---|---|---|---|
| 3,941,623 | 3/1976 | Takashina et al. | 148/113 |
| 4,632,708 | 12/1986 | Konno et al. | 148/113 |

FOREIGN PATENT DOCUMENTS

| 45-25589 | 8/1970 | Japan | 148/113 |
|---|---|---|---|
| 61-201732 | 9/1986 | Japan | 148/113 |

Primary Examiner—John P. Sheehan
Attorney, Agent, or Firm—Austin R. Miller

[57] ABSTRACT

As to a method of producing grain oriented silicon steel sheets used in stacked lamination-core transformers, which realizes the improvement of magnetic properties, particularly extreme reduction of iron loss irrespectively of a high temperature heat treatment such as strain relief annealing and can attain the improvement of compressive stress dependence of magnetostriction and lamination factor, it is a main point that the steel sheet after the finish annealing is provided on its surface with a thin coat of at least one layer composed mainly of nitrides and carbides of Ti, Zr, Hf, V, Nb, Ta, Mn, Cr, Mo, W, Co, Ni, Al, B and Si and strongly adhered to the surface of the steel sheet through a mixed layer of base metal and thin coat.

23 Claims, 6 Drawing Figures

FIG_2

◎ $B_{10} > 1.92T$, $W_{17/50} < 0.66 W/kg$

⊚ $B_{10} > 1.92T$, $W_{17/50} < 0.70 W/kg$

○ $B_{10} = 1.92 \sim 1.90T$, $W_{17/50} = 0.70 \sim 0.80 W/kg$

△ $B_{10} < 1.90T$, $W_{17/50} > 0.80 W/kg$

METHOD OF PRODUCING EXTRA-LOW IRON LOSS GRAIN ORIENTED SILICON STEEL SHEETS

TECHNICAL FIELD

Lately, remarkable developments and efforts for satisfying the improvement of electrical and magnetic properties in grain oriented silicon steels, particularly ultimate demand on reduction of iron loss are gradually producing good results. However, when practically using such grain oriented silicon steel sheets, it is a serious problem that the degradation of the above properties is unavoidably caused when the steel sheet is subjected to a so-called strain relief annealing after its working and assembling and the use application is restricted undesirably. Therefore, this invention develops a new measure for advantageously satisfying the above demands irrespectively of a high temperature heat treatment such as strain relief annealing, and more particularly it relates to a method of producing grain oriented silicon steel sheets which can advantageously attain the improvement of compressive stress dependence of magnetostriction and lamination factor in the grain oriented silicon steel sheet.

BACKGROUND ART

As is well-known, the grain oriented silicon steel sheet, wherein secondary recrystallized grains are highly aligned in (110)[001] orientation, namely Goss orientation, is mainly used as a core for transformer and other electrical machinery and equipment. In this case, it is required that the magnetic flux density (represented by $B_{10}$ value) is high, the iron loss (represented by $W_{17/50}$ value) is low and, in addition to these properties, the magnetostriction property and lamination factor are excellent.

Since these grain oriented silicon steel sheets are usually manufactured through many complicated steps, a great of inventions and improvements are applied to the above steps, whereby low iron loss grain oriented silicon steel sheets having $B_{10}$ of not less than 1.90 T and $W_{17/50}$ of not more than 1.05 W/kg when the product thickness is 0.30 mm, or $B_{10}$ of not less than 1.89 T and $W_{17/50}$ of not more than 0.90 W/kg when the product thickness is 0.23 mm are manufactured up to the present.

Lately, supreme demands on the reduction of power loss become considerable in view of energy-saving. Particularly, a system of "Loss Evaluation" wherein the reduction percentage of iron loss is converted into a money to load on the cost of the transformer in the manufacture of low loss transformer is widely spread in Europe and America.

Under the above circumstances, there has recently been proposed a method wherein local microstrain is introduced into the surface of the grain oriented silicon steel sheet by irradiating a laser beam onto the steel sheet surface in a direction substantially perpendicular to the rolling direction after the finish annealing to thereby conduct refinement of magnetic domains and hence reduce the iron loss (Japanese Patent Application Publication Nos. 57-2252, 57-53419, 58-5968, 58-26405, 58-26406, 58-26407 and 58-36051).

Such a magnetic domain refinement is effective for the grain oriented silicon steel sheet not subjected to the strain relief annealing in the manufacture of stacked lamination-core type transformers. However, in case of wound-core type transformers, the strain relief annealing is necessarily performed after the magnetic domain refinement, so that the local microstrain produced by laser irradiation on purpose is released by the annealing treatment to make the width of magnetic domains wide and consequently the laser irradiating effect is lost.

On the other hand, Japanese Patent Application Publication No. 52-24499 discloses a method of producing an extra-low iron loss grain oriented silicon steel sheet wherein the surface of the grain oriented silicon steel sheet is subjected to a mirror finishing after the final annealing or a metal thin plating is applied to the mirror finished surface or further an insulation coating is baked thereon.

However, the mirror finishing for improving the iron loss does not sufficiently contribute to the reduction of iron loss in comparison with remarkable cost-up of the manufacturing step. Particularly, there is a problem on the adhesion property to the insulation coating indispensably applied and baked after the mirror finishing. Therefore, such a mirror finishing is not yet adopted in the present manufacturing step.

Further, there is proposed a method, wherein the steel sheet surface is subjected to the mirror finishing and then a thin coat of oxide ceramics is deposited thereon, in Japanese Patent Application Publication No. 56-4150. In this method, however, the ceramic coat is peeled off from the steel sheet surface when being subjected to a high temperature annealing above 600° C., so that it can not be adopted in the actual manufacturing step.

In addition to the problems accompanied with the countermeasures for the extreme reduction of iron loss as mentioned above, a magnetostriction can not be overlooked in the grain oriented silicon steel sheet. This is a phenomenon that the steel sheet is subjected to stretching vibrations during the magnetization of the steel sheet, which is a most serious cause on the occurrence of noise in the transformer. The magnetostriction behavior results from the fact that the magnetization process of the steel sheet includes 90° boundary displacement and rotation magnetization. That is, the magnetostriction increases in accordance with compressive stress applied to the steel sheet. Since the compressive is irreversibly applied to the steel sheet in the assembling of the transformer, it is advantageous that a tension is previously applied to the steel sheet in view of the compressive stress dependence of magnetostriction. Of course, the application of the tension to the steel sheet is effective for improving the iron loss in the grain oriented silicon steel sheet, and its effect is conspicuous.

In general, the grain oriented silicon steel sheet is subjected to a tension by a double coating consisting of a forsterite layer, which is produced by high temperature reaction between oxides of Si and Fe called as fayalite ($Fe_2SiO_4$) usually formed on the steel sheet surface through decarburization and primary recrystallization annealing before secondary recrystallization and an annealing separator composed mainly of MgO in the final annealing, and an insulation coating produced on the forsterite layer (e.g., which consists mainly of phosphate and colloidal silica), whereby the magnetostriction property is improved. However, it can not be said that the compressive stress dependence of magnetostriction is sufficiently improved by such a conventional method.

In order to improve the magnetostriction property, there has been attempted the development of insulation coating capable of applying an elastic tension to the steel sheet surface by high temperature baking of a vitreous insulation coating having a small thermal expansion coefficient (Japanese Patent Application Publication No. 56-521117 or 53-28375), but this attempt is still lacking in the effectiveness.

Further, the lamination factor of the grain oriented silicon steel sheet is expressed by an amount (represented by %) of base metal effectively contributing to magnetic properties, which is obtained by removing forsterite layer and insulation baked coating from the surface of the steel sheet during the final annealing. It is also important to increase this lamination factor. In order to increase the lamination factor, it is known that the surface roughness of the steel sheet is made small or the thickness of each of the forsterite layer and insulation baked coating is made thin. However, although the thinning of these coatings increases the lamination factor, it is very difficult to stably form the thin coating having a good surface appearance and excellent adhesion property and uniformity at the actual manufacturing step, so that there is a limit in the increase of the lamination factor.

DISCLOSURE OF INVENTION

The invention is to provide a method of producing a grain oriented silicon steel sheet in connection with the formation of extra-thin tensile coat capable of overcoming problems on adhesion property and durability of insulation layer without degrading the properties even in high temperature treatment, which effectively induces the improvement of magnetic properties aiming at the extreme reduction of iron loss and advantageously realizes the improvement of compressive stress dependence of magnetostriction and lamination factor, and is based on a novel knowledge that a thin coat of nitride and/or carbide as mentioned later, which is strongly adhered to the finished surface of the grain oriented silicon steel sheet, can have a heat stability and extremely reduce the iron loss and simultaneously achieve the improvement of compressive stress dependence of magnetostriction and lamination factor.

That is, the invention lies in a method of producing an extra-low iron loss grain oriented silicon steel sheet, which comprises subjecting a silicon containing steel slab to a hot rolling, subjecting the resulting hot rolled steel sheet to one or two cold rolling through an intermediate annealing to form a cold rolled steel sheet having a given final gauge, subjecting the cold rolled steel sheet to decarburization and primary recrystallization annealing, applying an annealing separator onto the surface of the treated sheet, subjecting the coated sheet to a finish annealing and to secondary recrystallization annealing for developing secondary recrystallization grains in {110}<001> orientation and a purification annealing, removing the resulting oxide from the surface of the sheet, and forming on the sheet surface a thin coat of at least one layer composed mainly of at least one of nitrides and/or carbides of Ti, Zr, Hf, V, Nb, Ta, Mn, Cr, Mo, W, Co, Ni, Al, B and Si and strongly adhered to the surface of base metal through a mixed layer of the base metal and the thin coat.

According to this method, the extreme reduction of iron loss, which is fairly higher than the highest magnetic properties of the prior art, can be accomplished under sufficient heat stability, and the compressive stress dependence of magnetostriction and lamination factor can effectively be improved.

The invention will be described with respect to experimental details resulting in the success of the invention with reference to the ion plating apparatus shown in FIG. 1.

EXPERIMENT 1

A continuously cast slab of silicon steel comprising 0.046% by weight (simply shown in % hereinafter) of C, 3.34% of Si, 0.068% of Mn, 0.023% of Se, 0.025% of Sb and 0.025% of Mo was heated at 1360° C. for 4 hours and then hot rolled to obtain a hot rolled steel sheet having a thickness of 2.0 mm.

The hot rolled steel sheet was subjected to a normalized annealing at 900° C. for 3 minutes, which was then subjected to a cold rolling two times through an intermediate annealing at 950° C. for 3 minutes to obtain a cold rolled steel sheet having a final gauge of 0.23 mm.

After the cold rolled steel sheet was subjected to decarburization and primary recrystallization annealing in a wet hydrogen atmosphere at 820° C., a slurry of an annealing separator composed mainly of MgO was applied onto the surface of the steel sheet. Then, the steel sheet was subjected to a secondary recrystallization annealing at 850° C. for 50 hours and further to a purification annealing in a dry hydrogen atmosphere at 1200° C. for 5 hours.

Thereafter, a part of the thus treated steel sheet was pickled with a solution of $H_2SO_4$ at 80° C. to remove a forsterite layer from the steel sheet surface, and then subjected to a chemical polishing with a mixed solution of 3% Hf and $H_2O_2$, whereby the surface of the steel sheet was rendered into a mirror finished state having a center-line average roughness of 0.1 μm. The thus obtained steel sheet was divided into three samples, two of which were subjected to an ion plating using the ion plating apparatus shown in FIG. 1 to form thin coats of $Al_2O_3$ and TiN with a thickness of 0.5 μm on the mirror finished surface, respectively.

Figure 1:
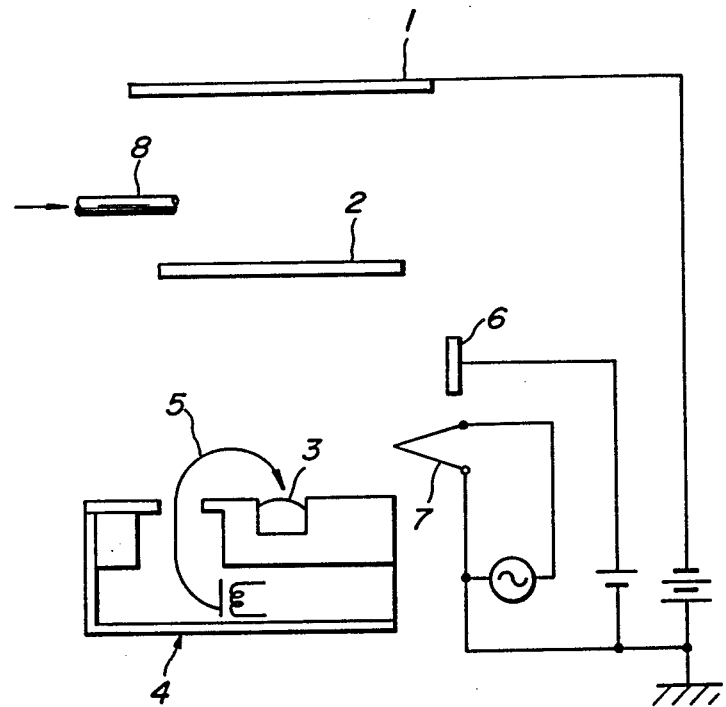
FIG. 1 is a skeleton view of an ion plating apparatus.

In FIG. 1, numeral 1 is a mirror finished base metal to be tested, numeral 2 a shutter, numeral 3 a crucible, numeral 4 an electron gun, numeral 5 an electron beam, numeral 6 an ionization electrode, numeral 7 a thermionic emission electrode, and numeral 8 an inlet for reactive gas such as $N_2$, $C_2H_2$, $O_2$ or the like.

After the ion plating, each of the sheet samples was subjected to a coating treatment with a coating solution consisting mainly of phosphate and colloidal silica (or the formation of an insulation baked coating).

For the comparison, the remaining one sample was subjected on its mirror finished surface to a copper vapor evaporation treatment at a thickness of 0.5 μm in the conventionally well-known manner and further to a coating treatment with a coating solution consisting mainly of phosphate and colloidal silica.

The magnetic properties and adhesion property of the resulting products were measured to obtain results as shown in the following Table 1.

In order to obtain an extra-low iron loss product, the optimum finished surface is required to be a mirror finished state having a center-line average roughness of

TABLE 1

| Treating conditions | Magnetic properties | | Adhesion property | | Total thickness (mm) |
| --- | --- | --- | --- | --- | --- |
| | $B_{10}(T)$ | $W_{17/50}(W/kg)$ | bending diameter* (mm) | evaluation** | |
| (a) conventional treatment (formation of insulation coating on forsterite layer) | 1.905 | 0.87 | 30 | o | 0.229 |
| (b) formation of insulation coating after evaporating treatment on mirror finished surface | 1.913 | 0.73 | 50 | x | 0.223 |
| (c) formation of insulation coating after ion plating of $Al_2O_3$ on mirror finished surface | 1.915 | 0.72 | 45 | x | 0.220 |
| (d) formation of insulation coating after ion plating of TiN on mirror finished surface | 1.920 | 0.68 | 30 | o | 0.221 |

*diameter causing no peeling at 180° bending
**o: good x: bad

As seen from Table 1, the conventional product (a) obtained by applying the coating treatment to the forsterite layer formed on the steel sheet surface in the finish annealing has $B_{10}$ of 1.905 T and $W_{17/50}$ of 0.87 W/kg as magnetic properties, wherein the adhesion property of the insulation coating is good in a way. While, when the product (b) is manufactured by removing the forsterite layer formed on the steel sheet surface during the final annealing through pickling, rendering the forsterite-free steel sheet surface into a mirror finished state through chemical polishing, and then subjecting such a mirror finished surface to a copper vapor evaporation and a coating treatment, the magnetic properties are moderately improved to $B_{10}=1.913$ T and $W_{17/50}=0.73$ W/kg, but the adhesion property of the insulation baked coating through copper vapor evaporation is insufficient.

On the other hand, in the product (c) obtained by removing the forsterite layer after the final annealing, rendering the surface into a mirror finished state through chemical polishing and particularly subjecting to the same coating treatment through the ion plating to form $Al_2O_3$ thin coat, the magnetic properties are somewhat improved to $B_{10}=1.915$ T and $W_{17/50}=0.72$ W/kg, but the adhesion property of the insulation baked coating is still insufficient though it is somewhat better than that of the product (b).

On the contrary, when the TiN thin coat is formed as in the product (d) according to the invention, the magnetic properties are extremely good as $B_{10}=1.920$ T and $W_{17/50}=0.68$ W/kg and the adhesion property of the insulation baked coating is well maintained.

Figure 2:
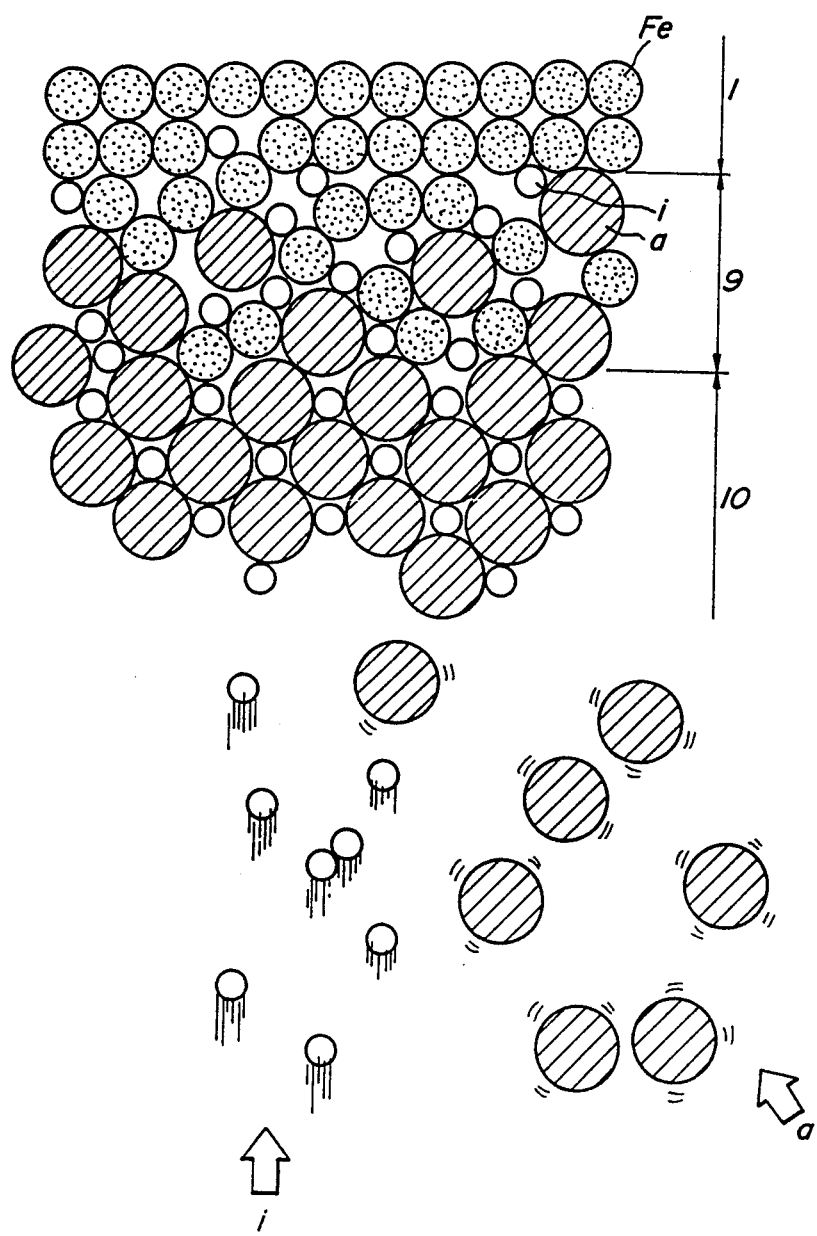
FIG. 2 is a schematic view illustrating the formation behavior of a thin coat composed mainly of nitride and carbide.

Such an improvement of the magnetic properties and adhesion property is based on the following fact. That is, as schematically shown in FIG. 2, a mixed layer 8 of accelerated ions i and deposition atoms a is formed on the surface of the silicon steel sheet as a base metal 1 between the sheet and TiN thin coat 10 to considerably enhance the adhesion property, and consequently a strong tension is applied to the surface of the silicon steel sheet to thereby realize an extra-low iron loss which has never been attained in the prior art. In this case, the action of plastic microstrain is not utilized, so that there is caused no problem on the heat stability, and consequently the electrical and magnetic properties are not influenced under a high temperature heat treatment such as strain relief annealing.

$Ra \leq 0.4$ μm. When $Ra > 0.4$ μm, the degree of reduction of iron loss tends to somewhat decrease, but the effect of reducing the iron loss according to the method of the invention is still superior as compared with the case of performing the conventionally well-known method. For instance, according to the method of the invention, the significant effect can be expected even when the oxides are merely removed from the finished surface by a chemical process such as pickling or a mechanical process such as cutting or grinding as mentioned later.

Furthermore, the thickness of TiN thin coat is adapted within a range of 0.005–5 μm, preferably 0.05–1.5 μm.

The strong adhesion of the TiN thin coat 10 to the mirror finished surface of the steel sheet through the mixed layer 9 is advantageously produced by anyone of PVD (Physical Vapor Deposition) process and CVD (Chemical Vapor Deposition) process. Besides, there may be employed a method wherein a metal is deposited on the steel sheet surface and then reacted near the surface in its atmosphere to form TiN thin coat.

EXPERIMENT 2

The experimental results on the compressive stress dependence of magnetostriction are as follows.

A continuously cast slab of silicon steel comprising 0.045% of C, 3.38% of Si, 0.063% of Mn, 0.021% of Se, 0.025% of Sb and 0.025% of Mo was heated at 1340° C. for 4 hours and then hot rolled to obtain a hot rolled steel sheet having a thickness of 2.0 mm.

Then, the hot rolled steel sheet was subjected to a normalized annealing at 900° C. for 3 minutes and further to a cold rolling two times through an intermediate annealing at 950° C. for 3 minutes to obtain a cold rolled steel sheet having a final gauge of 0.23 mm.

Thereafter, the cold rolled steel sheet was subjected to decarburization and primary recrystallization annealing at 820° C. in a wet hydrogen atmosphere, coated with a slurry of an annealing separator composed of $Al_2O_3$ (70%) and MgO (30%), and then subjected to a secondary recrystallization annealing at 850° C. for 50 hours and further to a purification annealing at 1200° C. in a dry hydrogen atmosphere for 5 hours.

The thus treated steel sheet was pickled with a solution of HCl at 70° C. to remove oxides from the steel sheet surface and then subjected to a chemical polishing with a mixed solution of 3% HF and $H_2O_2$ to render the surface into a mirror finished state having a center-line average roughness of 0.05 μm.

Then, a thin coat of TiN with a thickness of 0.7 μm was formed on the mirror finished surface by CVD reaction in a mixed gas atmosphere of $TiCl_4$, $H_2$ and $N_2$ at 750° C. for 20 hours using CVD apparatus.

After an insulation baked coating consisting mainly of phosphate and colloidal silica was formed on the steel sheet surface, the sheet was subjected to a strain relief annealing at 800° C. for 2 hours to obtain a product. The compressive stress dependence of magnetostriction and magnetic properties of the resulting product are shown in FIG. 3 together with those of a product obtained by the usual manufacturing process (comparative product).

Moreover, the comparative product was manufactured by subjecting a part of the above cold rolled steel sheet of 0.23 mm in gauge to decarburization and primary recrystallization annealing at 820° C. in a wet hydrogen atmosphere, applying an annealing separator composed mainly of MgO to the steel sheet surface, subjecting to a secondary recrystallization annealing at 850° C. for 50 hours and a purification annealing at 1200° C. in a dry hydrogen atmosphere for 5 hours and baking an insulation baked coating consisting mainly of phosphate and colloidal silica onto the forsterite layer formed on the forsterite layer as mentioned above.

Figure 3:
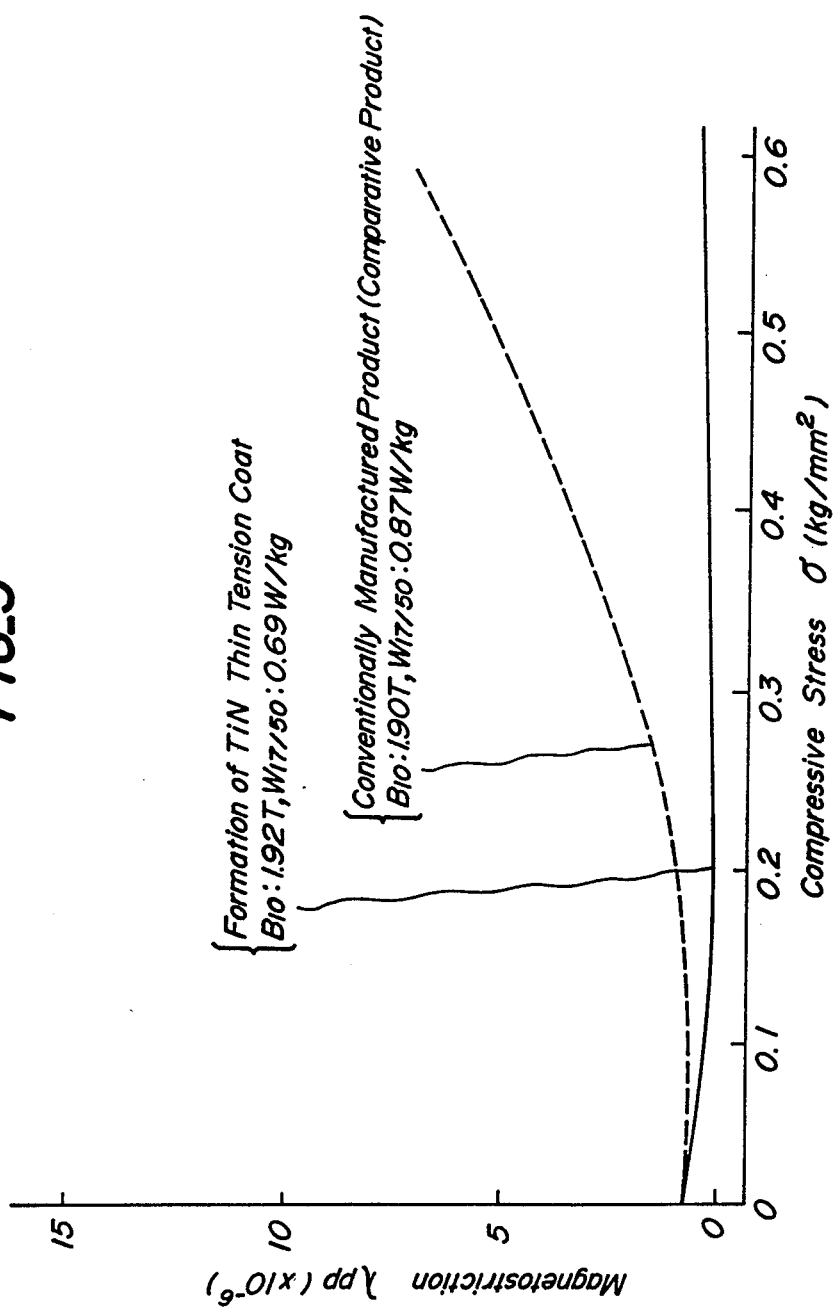
FIGS. 3 and 4 are graphs showing comparisons on compressive stress dependence of magnetostriction, respectively.

As seen from FIG. 3, the product provided with the TiN thin coat has very excellent magnetic properties of $B_{10} = 1.92$ T and $W_{17/50} = 0.69$ W/kg, and also the increase of magnetostriction $\lambda_{pp}$ is very little even when the compressive stress $\sigma$ is increased up to 0.6 kg/mm².

On the contrary, in the product manufactured by the usual manufacturing process (comparative product), $B_{10}$ is 1.90 T and $W_{17/50}$ is 0.87 W/kg as magnetic properties, but the magnetostriction $\lambda_{pp}$ increases with the increase of the compressive stress $\sigma$. For instance, the magnetostriction $\lambda_{pp}$ reaches $3.2 \times 10^{-4}$ at the compressive stress $\sigma$ of 0.4 kg/mm².

EXPERIMENT 3

A continuously cast slab of silicon steel comprising 0.043% of C, 3.36% of Si, 0.062% of Mn, 0.021% of Se, 0.025% of Sb and 0.025% of Mo was heated at 1360° C. for 4 hours and then hot rolled to obtain a hot rolled steel sheet having a thickness of 2.4 mm.

The hot rolled steel sheet was subjected to a normalized annealing at 900° C. for 3 minutes and further to a cold rolling two times through an intermediate annealing at 950° C. for 3 minutes to obtain a cold rolled steel sheet having a final gauge of 0.23 mm.

Next, the cold rolled steel sheet was subjected to decarburization and primary recrystallization annealing at 820° C. in a wet hydrogen atmosphere, coated with an annealing separator composed of $Al_2O_3$ (70%) and MgO (30%), and then subjected to a secondary recrystallization annealing at 850° C. for 50 hours and further to a purification annealing at 1200° C. in a dry hydrogen atmosphere for 5 hours.

Thereafter, the steel sheet was pickled with a solution of HCl at 70° C. to remove oxides from the steel sheet surface and then subjected to a chemical polishing with a mixed solution of 3% HF and $H_2O_2$ to render the surface into a mirror finished state having a center-line average roughness of 0.05 μm.

Next, a thin tension coat of AlN with a thickness of 0.8 μm was formed on the mirror finished surface by CVD reaction in a mixed gas atmosphere of $AlCl_3$, $H_2$ and $N_2$ at 800° C. for 15 hours using CVD apparatus.

After an insulation baked coating consisting mainly of phosphate and colloidal silica was formed on the steel sheet surface, the steel sheet was subjected to a strain relief annealing at 800° C. for 2 hours to obtain a product.

Figure 4:
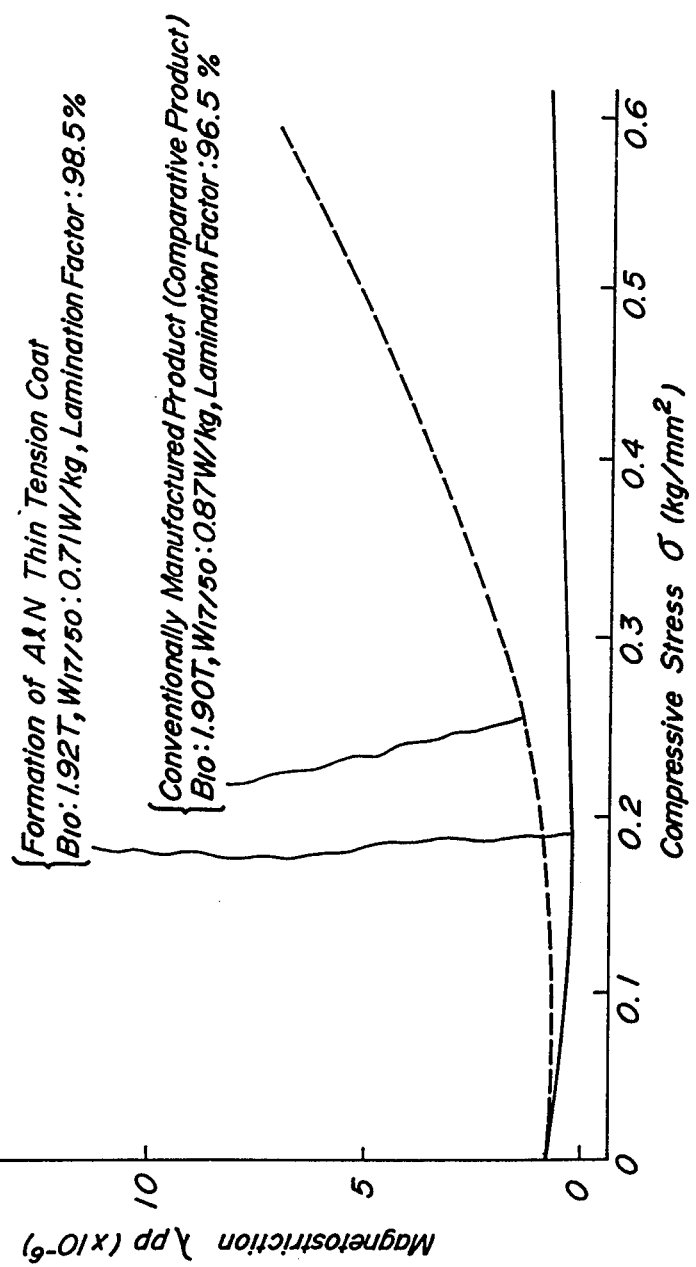

The compressive stress dependence of magnetostriction, magnetic properties and lamination factor of the resulting product are shown in FIG. 4 together with those of a product obtained by the usual manufacturing process (comparative product).

Moreover, the comparative product was manufactured by subjecting a part of the above cold rolled steel sheet of 0.23 mm in gauge to decarburization and primary recrystallization annealing at 820° C. in a wet hydrogen atmosphere, applying an annealing separator composed mainly of MgO to the steel sheet surface, subjecting to a secondary recrystallization annealing at 850° C. for 50 hours and a purification annealing at 1200° C. in a dry hydrogen atmosphere for 5 hours and baking an insulation baked coating consisting mainly of phosphate and colloidal silica onto the forsterite layer formed on the forsterite layer as mentioned above.

As seen from FIG. 4, the product provided with the AlN thin coat has very excellent magnetic properties of $B_{10} = 1.92$ T and $W_{17/50} = 0.71$ W/kg, and is very little in the increase of magnetostriction because magnetostriction $\lambda_{pp}$ is $0.25 \times 10^{-6}$ at compressive stress $\sigma$ of 0.4 kg/mm² and $0.70 \times 10^{-6}$ at compressive stress $\sigma$ of 0.6 kg/mm². Further, it should be noted that the lamination factor is extremely increased to 98.5%.

On the contrary, in the product obtained by the usual process (comparative product), $B_{10}$ is 1.90 T and $W_{17/50}$ is 0.87 W/kg as magnetic properties, but the magnetostriction $\lambda_{pp}$ considerably increases with the increase of the compressive stress $\sigma$. For instance, the magnetostriction $\lambda_{pp}$ becomes 3.2 at compressive stress $\sigma$ of 0.4 kg/mm².

The lamination factor of this comparative product is 96.5%, which is worse by about 2% than that of the product according to the invention.

As apparent from the results of Table 1 and FIGS. 3 and 4, according to the method of producing the grain oriented silicon steel sheets according to the invention, the improvement of magnetic properties such as high magnetic flux density and extra-low iron loss as well as the compressive stress dependence of magnetostriction and the lamination factor is achieved. Further, the degradation of magnetic properties and adhesion property is not caused even when the product is subjected to a stress relief annealing.

EXPERIMENT 4

A slab of silicon steel comprising 0.046% of C, 3.39% of Si, 0.067% of Mn, 0.023% of Se, 0.025% of Sb and 0.026% of Mo was heated at 1360° C. for 4 hours and then hot rolled to obtain a hot rolled steel sheet of 2.2 mm in thickness.

Thereafter, the hot rolled steel sheet was subjected to a cold rolling two times through an intermediate annealing at 950° C. to obtain a cold rolled steel sheet of 0.23 mm in final gauge.

Then, the cold rolled steel sheet was subjected to decarburization and primary recrystallization annealing at 820° C. in a wet hydrogen atmosphere, and coated with a slurry of an annealing separator composed of $Al_2O_3$ (70%), MgO (25%) and $ZrO_2$ (5%). Subsequently, the steel sheet was subjected to a secondary recrystallization annealing at 850° C. for 50 hours and further to a purification annealing at 1200° C. in a dry hydrogen atmosphere for 10 hours.

After the oxides were removed from the steel sheet surface, the steel sheet was subjected to a chemical polishing to render the surface into a mirror finished state having a center-line average roughness of 0.1 μm.

Next, a thin coat of TiN (thickness: 0.8 μm) was formed on the steel sheet surface by an ion plating wherein the steel sheet was heated under a tension using such a laboratory apparatus that the sample could be heated up to 1300° C. while applying a load of up to 3 kg/mm² to the sample as an ion plating apparatus.

After the formation of such a TiN thin coat, the steel sheet was subjected to a coating treatment with a coating solution consisting mainly of phosphate and colloidal silica. In this case, the experimental results on the magnetic properties of the resulting product are shown in FIG. 5 by a relation between the temperature and the tensile load of the sample during the ion plating.

Figure 5:
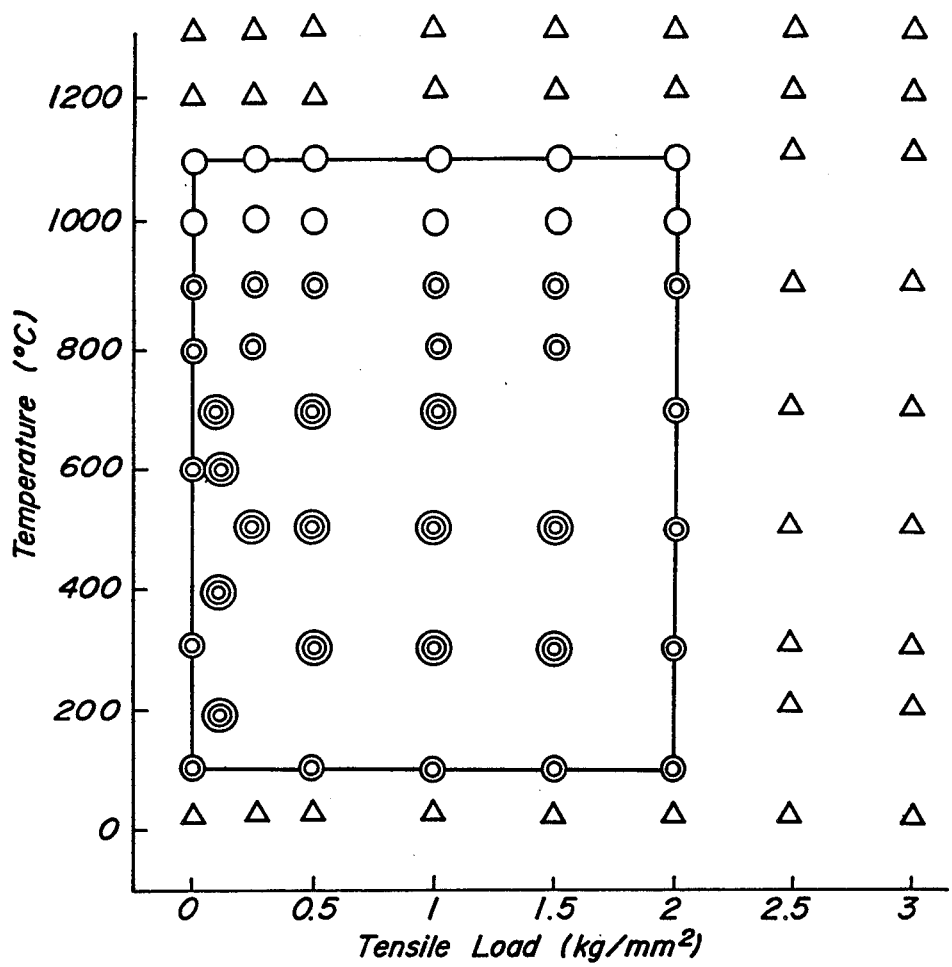
FIGS. 5 and 6 are graphs showing comparisons on the effect of tension application, respectively.

As seen from FIG. 5, very excellent magnetic properties were stably obtained when the temperature of the sample was within a range of 100°–1100° C., preferably 200°–700° C. and the tensile load was not more than 2 kg/mm², preferably 0.1–1.5 kg/mm² in the ion plating.

EXPERIMENT 5

A slab of silicon steel comprising 0.044% of C, 3.32% of Si, 0.066% of Mn, 0.022% of Se, 0.025% of Sb and 0.022% of Mo was heated at 1380° C. for 6 hours and then hot rolled to obtain a hot rolled steel sheet of 2.3 mm in thickness.

Thereafter, the hot rolled steel sheet was subjected to a cold rolling two times through an intermediate annealing at 950° C. to obtain a cold rolled steel sheet of 0.23 mm in final gauge.

Then, the cold rolled steel sheet was subjected to decarburization and primary recrystallization annealing at 820° C. in a wet hydrogen atmosphere, and coated with a slurry of an annealing separator composed of $Al_2O_3$ (65%), MgO (30%), $ZrO_2$ (3%) and $TiO_2$ (2%). Subsequently, the steel sheet was subjected to a secondary recrystallization annealing at 850° C. for 50 hours and further to a purification annealing at 1200° C. in a dry hydrogen atmosphere for 5 hours.

After the oxides were removed from the steel sheet surface, the steel sheet was subjected to an electrolytic polishing to render the surface into a mirror finished state having a center-line average roughness of 0.1 μm.

Next, a thin coat of TiN (thickness: 0.9 μm) was formed on the steel sheet surface by treating in a mixed gas of $TiCl_4$, $H_2$ and $N_4$ while heating under a tension with such a laboratory apparatus that the sample could be heated up to 1300° C. while applying a load of up to 3 kg/mm² to the sample as a CVD apparatus.

After CVD treatment, the steel sheet surface was subjected to a coating treatment with a coating solution consisting of phosphate and colloidal silica.

Figure 6:
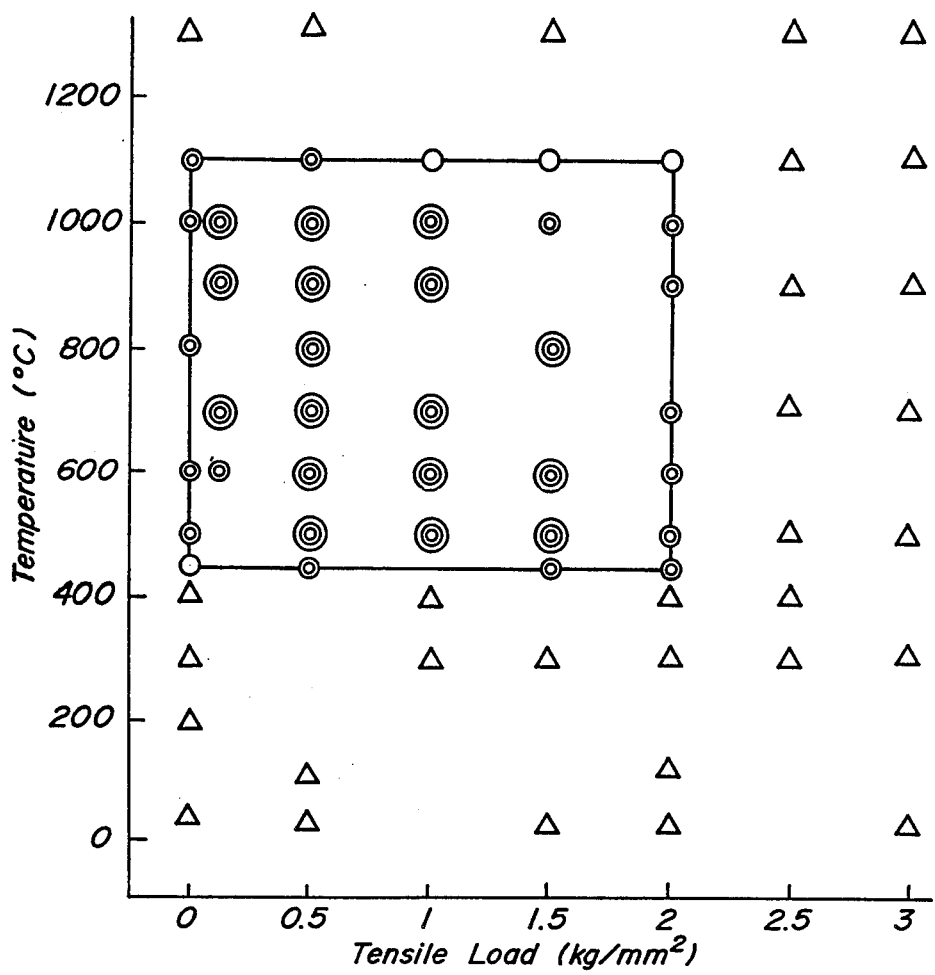

The experimental results on the magnetic properties of the resulting product are shown in FIG. 6 by a relation between the temperature and the tensile load of the sample in the CVD treatment.

As seen from FIG. 6, very excellent magnetic properties were stably obtained when the sample temperature was within a range of 450°–1100° C., preferably 500°–1000° C. and the tension was 2 kg/mm², desirably 0.1–1.5 kg/mm² in CVD.

Further, it has been confirmed that the same effect is obtained from experiments similar to the above on nitrides other than TiN and AlN as mentioned above and carbides inclusive of Ti.

The steps of producing the grain oriented silicon steel sheets according to the invention will be described below.

As a base metal, there may be used any of conventionally well-known silicon steel compositions, a typical example of which includes:

① composition having C: 0.01–0.06%, Si: 2.0–4.0%, Mn: 0.01–0.2% and 0.005–0.05% in total of at least one of S and Se;

② composition having C: 0.01–0.06%, Si: 2.0–4.0%, Mn: 0.01–0.2%, Sb: 0.005–0.2%, and 0.005–0.05% in total of at least one of S and Se;

③ composition having C: 0.01–0.06%, Si: 2.0–4.0%, Mn: 0.01–0.2%, Sb: 0.005–0.2%, Mo: 0.003–0.1% and 0.005–0.05% in total of at least one of S and Se;

④ composition having C: 0.01–0.06%, Si: 2.0–4.0%, Mn: 0.01–0.2%, sol.Al: 0.005–0.06%, N: 0.001–0.01% and 0.005–0.05% in total of at least one of S and Se;

⑤ composition having C: 0.01–0.06%, Si: 2.0–4.0%, Mn: 0.01–0.2%, sol.Al: 0.005–0.06%, N: 0.001–0.01%, Mo: 0.003–0.1% and 0.005–0.05% in total of at least one of S and Se;

⑥ composition having C: 0.01–0.06%, Si: 2.0–4.0%, Mn: 0.01–0.2%, sol.Al: 0.005–0.06%, N: 0.001–0.01%, Sn: 0.01–0.5%, Cu: 0.01–1.0% and 0.005–0.05% in total of at least one of S and Se;

⑦ composition having C: 0.01–0.06%, Si: 2.0–4.0%, Mn: 0.01–0.2%, B: 0.0003–0.02%, N: 0.001–0.01% and 0.005–0.05% in total of at least one of S and Se;

⑧ composition having C: 0.01–0.06%, Si: 2.0–4.0%, Mn: 0.01–0.2%, B: 0.0003–0.02%, N: 0.001–0.01%, Cu: 0.01–1.0% and 0.005–0.05% in total of at least one of S and Se.

The adequate reason on the above compositions range is as follows:

C: 0.01–0.06%

When the amount of C is less than 0.01%, the control of hot rolled texture is difficult and large elongated grains are produced and consequently the magnetic properties are degraded. While, when the C amount exceeds 0.06%, the decarburization takes a long time and is uneconomical. Therefore, the C amount is necessary to be within a range of 0.01–0.06%.

Si: 2.0–4.0%

When the amount of Si is less than 2.0%, the electric resistance is low and the value of iron loss based on the increase of eddy-current loss becomes larger, while when it exceeds 4.0%, the brittle rupture is apt to be caused in the cold rolling, so that the Si amount is necessary to be within a range of 2.0–4.0%.

Mn: 0.01–0.2%

Mn is an element required for the formation of MnS or MnSe as a dispersed precipitate phase (or an inhibitor) controlling the secondary recrystallization of the grain oriented silicon steel sheet. When the amount of Mn is less than 0.01%, the amount of MnS or MnSe required for causing the secondary recrystallization is lacking as a whole, so that the secondary recrystallization is incompletely causes and at the same time the surface defect called as a blister increases. While, when it exceeds 0.2%, the dissolution/solution of MnS or MnSe and the like is difficult when heating the slab, and even if the dissolution/solution is performed, the dispersed precipitate phase of MnS or MnSe is apt to be coarsened during the hot rolling and consequently the optimum size distribution of the dispersed precipitate phase as an inhibitor is undesirably damaged and the magnetic properties are degraded. Therefore, the Mn amount is necessary to be within a range of 0.01–0.2%.

S: not less than 0.005%, Se: not less than 0.003%, or each or total is not more than 0.05%

When the amounts of S and Se are less than 0.005% and 0.003%, respectively, the effect for inhibition of normal grain growth of MnS and MnSe is weak, while when each amount of S and Se exceeds 0.05%, the hot and cold workabilities are considerably degraded. Therefore, the amount of each of S and Se is necessary to be within a range of 0.005–0.5% in case of S and a range of 0.003–0.05% in case of Se.

Mo: 0.003–0.1%

Mo is an inhibitor for normal grain growth (see Japanese Patent Application Publication Nos. 56-4613 and 57-14737). When the amount of Mo is less than 0.003%, the effect for inhibition of normal grain growth is not clear, while when it exceeds 0.1%, the hot and cold workabilities are degraded and also the iron loss increases, so that the Mo amount is necessary to be within a range of 0.003–0.1%.

Sb: 0.005–0.20%

As disclosed in Japanese Patent Application Publication Nos. 38-8214 and 51-13469, it is known that the normal grain growth is inhibited by including 0.005–0.1%, particularly 0.005–0.2% of Sb in silicon steel together with a slight amount of S or Se. When the amount is less than 0.005%, the effect for inhibition of normal recrystallized grain is little, while when it exceeds 0.2%, the magnetic flux density lowers to degrade the magnetic properties. Therefore, the Sb amount is necessary to be within a range of 0.005–0.20%.

Sol. Al: 0.005–0.06%

Al acts as a strong inhibitor by bonding with N contained in silicon steel to form a fine precipitate of AlN. Particularly, in order to grow secondary recrystallized grains in the heavy cold rolling at a draft of 80–95%, it is necessary to include Al in an amount of 0.005–0.06% as sol. Al in the silicon steel. When the amount of sol. Al is less than 0.005%, the amount of AlN fine precipitate as an inhibitor is lacking and the growth of secondary recrystallized grain with {110}<001> orientation is insufficient, while when it exceeds 0.06%, the growth of secondary recrystallized grain with {110}<001> orientation becomes rather bad.

B: 0.0003–0.02%

B bonds with N contained in the silicon steel to form fine precipitate of BN, but when the amount is too large, it is difficult to grow the secondary recrystallized grain with {110}<001> orientation, so that the amount is limited to a range of 0.0003–0.02%. Moreover, it is already known by Grenoble and Fiedler {H. E. Grenoble: *IEEE Trans. Mag.* May-13 (1977), p. 1427 and H. C. Fiedler: *IEEE Trans. Mag.* May-13 (1977), p. 1433} that the slight amount of B or BN fine precipitate effectively inhibits the grain boundary migration as an inhibitor.

N: 0.001–0.01%

N forms fine precipitate of AlN or BN by bonding with sol. Al or B contained in the silicon steel and acts as a strong inhibitor for inhibiting the growth of primary recrystallized grain. When the N amount is less than 0.001%, the amount of AlN or BN fine precipitate is lacking and the inhibition effect is weak and consequently the growth of secondary recrystallized grain with {110}<001> orientation is insufficient. While, when it exceeds 0.01%, the amount of solute N increases to bring about the increase of iron loss. Therefore, the amount of N is necessary to be within a range of 0.001–0.01%.

According to the invention, a small amount of at least one inhibitor-forming element selected from Cr, Ti, V, Zr, Nb, Ta, Co, Ni, Cu, Sn, P, As, Te and the like may be added to the silicon steel. For instance, as shown by K. Iwayama et al., in "Roles of Tin and Copper in the 0.23 mm: Thick High Permeability Grain Oriented Silicon Steel: J. Appl. Phys., 55 (1984), p 2136", it is effective to add small amounts of Cu and Sn to the silicon steel. Lately, a tendency of thinning the product thickness for the reduction of iron loss becomes stronger, but in this case the secondary recrystallization becomes unstable. Therefore, it is desirable to add about 0.01–0.5% of Sn, and further the addition of about 0.01–1.0% of Cu is favorable for the stabilization of the thin coat.

Then, a series of manufacturing steps according to the invention will be described.

At first, the components having a given base metal composition are melted in the conventionally well-known steel making furnace such as LD converter, electric furnace, open hearth or the like and then cast into a slab. It is a matter of course that vacuum treatment or vacuum dissolution may be applied during the melting.

After the resulting slab is subjected to a hot rolling in the usual manner, the resulting hot rolled steel sheet is subjected to a normalized annealing at a temperature of 800°–1200° C., and, if necessary, to a subsequent quenching treatment. Then, the thus treated steel sheet is cold rolled to a final product thickness of 0.15 mm–0.35 mm by a heavy cold rolling at once or by a two-times cold rolling through an intermediate annealing usually performed at 850° C.–1050° C. In the latter case, the draft is 50%–80% in the first cold rolling and 30%–80% in the second cold rolling.

The final cold rolled steel sheet is degreased and subjected to decarburization and primary recrystallization annealing in a wet hydrogen atmosphere at 750° C.–850° C.

Then, the thus treated surface of the steel sheet is coated with an annealing separator. In this case, according to the invention, the feature that forsterite always produced after the final annealing in the prior art is not formed is effective for simplifying the subsequent mirror finishing of the steel sheet surface. Therefore, it is preferable to use an annealing separator composed mainly of MgO as well as a mixture of MgO and not less than 50% of $Al_2O_3$, $ZrO_2$, $TiO_2$ or the like.

Thereafter, a secondary recrystallization annealing is performed for sufficiently growing secondary recrystallized grains with {110}<001> orientation. In general, this treatment is carried out by box annealing wherein the temperature of the steel sheet is rapidly raised to more than 1000° C. and then held at that temperature for a given time.

Moreover, it is advantageous that the isothermal annealing at a temperature of 820° C.–900° C. is carried out in order to highly grow the secondary recrystallized texture with {110}<001> orientation. Besides, a slow temperature-rise annealing at a rate of 0.5°–15° C./hr may be performed.

After the secondary recrystallization annealing, it is required that a purification annealing is carried out in a dry hydrogen atmosphere at a temperature above 1100° C. for 1-20 hours.

Then, the forsterite layer or oxide layer produced on the steel sheet surface as a residue is removed from this surface by a chemical removing process such as well-known pickling or the like, a mechanical removing process such as cutting, grinding or the like, or a combination of these processes.

After the removal of the oxide, the steel sheet surface is rendered into a mirror finished state by the conventional process such as chemical polishing, electropolishing, buffing, or a combination thereof, if necessary.

In order to obtain an extra-low iron loss product, the optimum finished surface is required to be a mirror finished state having a center-line average roughness of $Ra \leq 0.4$ $\mu$m. When $Ra > 0.4$ $\mu$m, the degree of reduction of iron loss tends to somewhat decrease, but the effect of reducing the iron loss according to the method of the invention is still superior as compared with the case of performing the conventionally well-known method. For instance, according to the method of the invention, the sufficient effect can be expected even when the oxides are merely removed from the finished surface by a chemical process such as pickling or a mechanical process such as cutting or grinding as mentioned above.

After the removal of the oxide or the mirror finishing, a thin coat of at least one layer composed of at least one of nitrides and/or carbides of Ti, Zr, Hf, V, Nb, Ta, Mn, Cr, Mo, W, Co, Ni, Al, B and Si is formed on the steel sheet surface through a mixed layer of the base metal and the thin coat, which is performed by CVD process and PVD process as previously mentioned. The former is preferably low-temperature CVD, high-temperature CVD, reduced pressure CVD, atmospheric pressure CVD, plasma CVD, laser CVD, photo CVD and the like, while the latter is preferably sputtering, ion plating, ion implantation and the like. In the former CVD process, as apparent from Experiment 6, extra-low iron loss products are stably obtained when the sample temperature in CVD is within a range of 450° C.-1100° C. under a tension of not more than 2 kg/mm². Furthermore, in the latter PVD process, as apparent from Experiment 5, extra-low iron loss products are stably obtained when the sample temperature in PVD is within a range of 100° C.-1100° C. under a tension of not more than 2 kg/mm². In the formation of the thin coat, the thickness should be controlled to a range of 0.005-5 $\mu$m because the tensioning effect of the thin coat is satisfied at not less than 0.005 $\mu$m, while the thickness of more than 5 $\mu$m is disadvantageous in view of lamination factor.

As another method of forming the thin coat, there is a method, wherein a vapor deposited layer of at least one element previously selected from Ti, Zr, Hf, V, Nb, Ta, Mn, Cr, Mo, W, Co, Ni, Al, B and Si is formed on the steel sheet surface after the removal of the oxide layer or the subsequent mirror finishing and then subjected to nitriding and/or carburizing treatment.

This nitriding and/or carburizing treatment is desirable to be a purification accelerating annealing of N, C in steel in a non-oxidizing atmosphere or an annealing accompanying nitriding or carburizing action in nitriding or carburizing gas atmosphere.

Moreover, the formation of the thin coat may be a section formation on the steel sheet surface, i.e. alternate formation of a coating region and uncoating region at a width of 1-50 mm and an interval of 1-20 mm across the rolling direction of the steel sheet, whereby the tension elastic strain on the steel sheet surface can be made ununiform to more advantageously reduce the iron loss due to magnetic domain refinement.

In any case, it is effective to form the thin coat at a thickness of about 0.005-5 $\mu$m.

When the thickness is less than 0.005 $\mu$m, the tension effect is small and the effect of reducing the iron loss is small, while when it exceeds 5 $\mu$m, the lamination factor lowers and the economical merit is lost, so that the thickness of the tension coat is preferably 0.005-5 $\mu$m.

Further, an insulation baked coating consisting mainly of phosphate and colloidal silica is formed on the thin coat by the conventionally well-known process. The formation of the insulation baked coating is, of course, required in the manufacture of transformers having a capacity as large as 1,000,000 KVA.

After the above treatment, local plastic strain can be applied to the steel sheet. For example, in case of laser irradiation process, a laser is YAG laser, and the use conditions are an energy of $1-10 \times 10^3$ J, a spot diameter of 0.05-0.2 mm, a center distance between spots of 0.1-0.5 mm and a distance between laser scanned positions of 3—30 mm.

After the laser irradiation, low-temperature insulation coating is performed below 600° C.

Such a low-temperature insulation coating is formed by baking at low temperature for utilizing the effect of laser irradiation, which may be performed with the conventionally well-known treating solution. As the method of applying local strain, discharge working, plasma jet working, water jet working, mechanical working such as drawing and so on may be used.

In the formation of the above thin coat, the extreme reduction of iron loss can also be achieved by alternately defining a thin coat forming region and a non-forming region without uniformly forming on the mirror finished steel sheet. That is, it is effective to alternately form these regions at a width of 1-50 mm and a distance of 1-20 mm. As such a section formation method, use may be made of the conventionally well-known processes such as masking and the like. On the thus formed thin coat is formed the insulation coating by baking.

BEST MODE OF CARRYING OUT THE INVENTION

Example 1

A slab of silicon steel containing 0.046% of C, 3.36% of Si, 0.068% of Mn, 0.022% of Se, 0.025% of Mo and 0.025% of Sb was hot rolled to obtain a hot rolled steel sheet of 2.4 mm in thickness.

Thereafter, the hot rolled steel sheet was subjected to a cold rolling two times through an intermediate annealing at 950° C. to obtain a cold rolled steel sheet of 0.23 mm in final gauge.

After the cold rolled steel sheet was subjected to decarburization and primary recrystallization annealing at 820° C. in a wet hydrogen, each of two treated steel sheets was coated at the steel sheet surface with (1) a slurry of an annealing separator composed mainly of MgO, or (2) a slurry of an annealing separator composed mainly of $Al_2O_3$ (60%), MgO (25%), $ZrO_3$ (10%) and $TiO_2$ (5%), which was then subjected to a secondary recrystallization annealing at 850° C. for 50 hours and further to a purification annealing at 1200° C. in a dry hydrogen for 5 hours.

Thereafter, (A) the steel sheet obtained by removing a forsterite layer or oxide layer from the steel sheet surface through pickling, and (B) the steel sheet obtained by rendering the surface after the pickling into a mirror finished state having a center-line average roughness of not more than 0.4μ through a chemical polishing were subjected to CVD process to form thin tension coats of TiN (thickness 0.6 μm) on the steel sheet surfaces.

A part of each of (A) and (B) was subjected to a coating treatment with a coating solution consisting mainly of phosphate and colloidal silica.

The magnetic properties of the resulting products are shown in the following Table 2 together with those of the conventionally manufactured product.

After they were subjected to decarburization and primary recrystallization annealing at 820° C. in a wet hydrogen, each of the two treated steel sheets was coated with (1) a slurry of an annealing separator composed mainly of MgO, or (2) a slurry of an annealing separator composed mainly of $Al_2O_3$ (60%), MgO (25%), $ZrO_2$ (10%) and $TiO_2$ (5%), which was then subjected to a secondary recrystallization annealing by raising temperature from 820° C. to 1050° C. at a rate of 5° C./hr and further to a purification annealing at 1200° C. in a dry hydrogen for 5 hours.

Thereafter, (A) the steel sheet obtained by removing a forsterite layer or oxide layer from the steel sheet surface through pickling, and (B) the steel sheet obtained by rendering the surface after the pickling into a

TABLE 2

| | Treatment at each step | | | | | | |
|---|---|---|---|---|---|---|---|
| | Annealing separator | | Surface treatment of steel sheet | | Coating | | |
| Steel components | (1) composed mainly of MgO | (2) $Al_2O_3$, MgO, $ZrO_2$, $TiO_2$ | (A) pickling | (B) chemical polishing | Phosphate and colloidal silica | Magnetic properties | |
| | | | | | | $B_{10}(T)$ | $W_{17/50}(W/kg)$ |
| Invention | | | | | | | |
| C 0.046% | o | | o | o | | 1.92 | 0.70 |
| Si 3.36% | | o | o | o | | 1.92 | 0.69 |
| Mn 0.068% | o | | o | o | o | 1.92 | 0.73 |
| Se 0.022% | | o | o | | | 1.91 | 0.79 |
| Mo 0.025% | o | | o | | | 1.91 | 0.78 |
| Sb 0.025% | | o | o | o | o | 1.92 | 0.75 |
| Conventional product | o | | | | o | 1.89 | 0.90 |

Example 2

(a) C: 0.038%, Si: 3.08%, Mn: 0.058% and S: 0.025%

(b) C: 0.039%, Si: 3.11%, Mn: 0.066%, S: 0.003%, Se: 0.019%

Two silicon steel slabs of the above chemical compositions were hot rolled to obtain two hot rolled steel sheets of 2.4 mm.

They were subjected to a cold rolling two times through an intermediate annealing at 950° C. to obtain two cold rolled steel sheets of 0.30 mm in final gauge.

mirror finished state having a center-line average roughness of not more than 0.4 μm through a chemical polishing were subjected to CVD to form thin tension coats of TiN (thickness 0.6 μm) on the steel sheet surfaces.

A part of each of (A) and (B) was subjected to a coating treatment with a coating solution consisting of phosphate and colloidal silica.

The magnetic properties of the resulting products are shown in the following Table 3 together with those of the conventionally manufactured product.

TABLE 3(a)

| | Treatment at each step | | | | | | |
|---|---|---|---|---|---|---|---|
| | Annealing separator | | Surface treatment of steel sheet | | Coating Phosphate | | |
| Steel components (wt %) | (1) composed mainly of MgO | (2) $Al_2O_3$, MgO, $ZrO_2$, $TiO_2$ | (A) pickling | (B) chemical polishing | and colloidal silica | Magnetic properties | |
| | | | | | | $B_{10}(T)$ | $W_{17/50}(W/kg)$ |
| Invention | | | | | | | |
| (a) C 0.038%, | o | | o | o | | 1.89 | 1.10 |
| Si 3.08%, | | o | o | o | | 1.89 | 1.08 |
| Mn 0.058%, | o | | o | o | o | 1.89 | 1.07 |
| S 0.025% | | o | o | | | 1.88 | 1.12 |
| | o | | o | | | 1.88 | 1.11 |
| | | o | o | o | o | 1.89 | 1.08 |
| Conventional product | o | | | | o | 1.86 | 1.28 |

TABLE 3(b)

| | Treatment at each step | | | | | | |
|---|---|---|---|---|---|---|---|
| | Annealing separator | | Surface treatment of steel sheet | | Coating Phosphate | | |
| Steel components (wt %) | (1) composed mainly of MgO | (2) $Al_2O_3$, MgO, $ZrO_2$, $TiO_2$ | (A) pickling | (B) chemical polishing | and colloidal silica | Magnetic properties | |
| | | | | | | $B_{10}(T)$ | $W_{17/50}(W/kg)$ |
| Invention | | | | | | | |
| (b) C 0.039%, | o | | o | o | o | 1.90 | 1.08 |
| Si 3.11%, | | o | o | o | | 1.90 | 1.06 |
| Mn 0.066%, | o | | o | o | o | 1.90 | 1.05 |
| S 0.003%, | | o | o | | | 1.89 | 1.10 |

TABLE 3(b)-continued

| Steel components (wt %) | Annealing separator (1) composed mainly of MgO | Annealing separator (2) $Al_2O_3$, MgO, $ZrO_2$, $TiO_2$ | Surface treatment of steel sheet (A) pickling | Surface treatment of steel sheet (B) chemical polishing | Coating Phosphate and colloidal silica | Magnetic properties $B_{10}(T)$ | Magnetic properties $W_{17/50}(W/kg)$ |
|---|---|---|---|---|---|---|---|
| Se 0.019% | o | | o | | | 1.89 | 1.09 |
| | | o | o | o | o | 1.90 | 1.09 |
| Conventional product | o | | | | o | 1.89 | 1.25 |

Example 3

(a) C: 0.046%, Si: 3.09%, Mn: 0.072%, S: 0.025%, Sol.Al: 0.020%, N: 0.069%

(b) C: 0.052%, Si: 3.39%, Mn: 0.081%, N: 0.073%, S: 0.031%, Sol.Al: 0.024%, Cu: 0.1%, Sn: 0.08%

(c) C: 0.049%, Si: 3.45%, Mn: 0.078%, S: 0.019%, Sol.Al: 0.025%, N: 0.069%

Three silicon steel slabs of the above chemical compositions were hot rolled to obtain three hot rolled steel sheets of 2.2 mm, which were subjected to a normalized annealing at 1150° C. for 3 minutes and quenching.

Then, the thus treated steel sheet was subjected to a cold rolling two times through an intermediate annealing at 950° C. to obtain a cold rolled steel sheet of 0.23 mm in final gauge.

After the cold rolled steel sheet was subjected to decarburization and primary recrystallization annealing at 840° C. in a wet hydrogen, each of two cold rolled steel sheets was coated with (1) a slurry of an annealing separator composed mainly of MgO, or (2) a slurry of an annealing separator composed of $Al_2O_3$ (60%), MgO (25%), $ZrO_2$ (10%) and $TiO_2$ (5%), which was then subjected to a secondary recrystallization annealing by raising temperature from 850° C. at a rate of 10° C./hr and further to a purification annealing at 1200° C. in a dry hydrogen for 5 hours.

Thereafter, (A) the steel sheet obtained by removing a forsterite layer or oxide layer from the steel sheet surface through pickling, and (B) the steel sheet obtained by rendering the surface after the pickling into a mirror finished state having a center-line average roughness of not more than 0.4 μm through a chemical polishing were subjected to CVD to obtain thin tension coats of TiN (thickness 0.6 μm) on the steel sheet surfaces.

A part of each of (A) and (B) was subjected to a coating treatment with a coating solution consisting of phosphate and colloidal silica.

The magnetic properties of the resulting products are shown in the following Table 4 together with those of the conventionally manufactured product.

TABLE 4(a)

| Steel components (wt %) | Annealing separator (1) composed mainly of MgO | Annealing separator (2) $Al_2O_3$, MgO, $ZrO_2$, $TiO_2$ | Surface treatment of steel sheet (A) pickling | Surface treatment of steel sheet (B) chemical polishing | Coating Phosphate and colloidal silica | Magnetic properties $B_{10}(T)$ | Magnetic properties $W_{17/50}(W/kg)$ |
|---|---|---|---|---|---|---|---|
| Invention | | | | | | | |
| (a) C 0.046%, | o | | o | o | | 1.95 | 0.73 |
| Si 3.09%, | | o | o | o | | 1.96 | 0.72 |
| Mn 0.072%, | o | | o | o | o | 1.95 | 0.76 |
| S 0.025%, | | o | o | | | 1.95 | 0.78 |
| N 0.069%, | o | | o | | | 1.95 | 0.79 |
| Sol.Al 0.026% | | o | o | o | o | 1.95 | 0.74 |
| Conventional product | o | | | | o | 1.94 | 0.89 |

TABLE 4(b)

| Steel components (wt %) | Annealing separator (1) composed mainly of MgO | Annealing separator (2) $Al_2O_3$, MgO, $ZrO_2$, $TiO_2$ | Surface treatment of steel sheet (A) pickling | Surface treatment of steel sheet (B) chemical polishing | Coating Phosphate and colloidal silica | Magnetic properties $B_{10}(T)$ | Magnetic properties $W_{17/50}(W/kg)$ |
|---|---|---|---|---|---|---|---|
| Invention | | | | | | | |
| (b) C 0.052%, | o | | o | o | | 1.93 | 0.69 |
| Si 3.39%, | | o | o | o | | 1.94 | 0.67 |
| Mn 0.081%, | o | | o | o | o | 1.94 | 0.65 |
| S 0.031%, | | o | o | | | 1.94 | 0.69 |
| N 0.073%, | o | | o | | | 1.93 | 0.68 |
| Sol.Al 0.024%, Cu 0.1%, Sn 0.08% | | o | o | o | o | 1.93 | 0.69 |
| Conventional product | o | | | | o | 1.92 | 0.90 |

TABLE 4(c)

| Steel components (wt %) | Annealing separator (1) composed mainly of MgO | Annealing separator (2) Al$_2$O$_3$, MgO, ZrO$_2$, TiO$_2$ | Surface treatment of steel sheet (A) pickling | Surface treatment of steel sheet (B) chemical polishing | Coating Phosphate and colloidal silica | Magnetic properties B$_{10}$(T) | Magnetic properties W$_{17/50}$(W/kg) |
|---|---|---|---|---|---|---|---|
| Invention | | | | | | | |
| (c) C 0.049%, | o | | o | o | o | 1.93 | 0.67 |
| Si 3.45%, | | o | o | o | | 1.94 | 0.74 |
| Mn 0.078%, | | o | o | | | 1.94 | 0.78 |
| S 0.019%, | o | | o | | o | 1.94 | 0.77 |
| Sol.Al 0.025%, | | o | o | o | | 1.93 | 0.73 |
| Mo 0.025%, | | | | | | | |
| N 0.0069% | | | | | | | |
| Conventional product | o | | | | o | 1.92 | 0.92 |

Example 4

(a) C: 0.043%, Si: 3.29%, Mn: 0.053%, S: 0.30%, B: 0.029%, Cu: 0.25%, N: 0.0076%

(b) C: 0.039%, Si: 3.39%, Mn: 0.062%, S: 0.028%, B: 0.0036%, Cu: 0.39%, N: 0.082%

(c) C: 0.038%, Si: 3.28%, Mn: 0.063%, S: 0.027%, B: 0.0028%, N: 0.0068%

A silicon steel slab of the above chemical composition was hot rolled to obtain a hot rolled steel sheet of 2.3 mm in thickness, which was subjected to a normalized annealing at 950° C. for 3 minutes.

Then, the steel sheet was subjected to a cold rolling two times (first cold rolling: about 80%, second cold rolling: about 50%) through an intermediate annealing at 900° C. to about a cold rolled steel sheet of 0.23 mm in final gauge.

After the cold rolled steel sheet was subjected to decarburization and primary recrystallization annealing at 830° C. in a wet hydrogen, each of two cold rolled steel sheets was coated with (1) a slurry of an annealing separator composed mainly of MgO, or (2) a slurry of an annealing separator composed of Al$_2$O$_3$ (60%), MgO (25%), ZrO$_2$ (10%) and TiO$_2$ (5%), which was then subjected to a secondary recrystallization annealing by raising temperature from 850° C. at a rate of 10° C./hr and further to a purification annealing at 1200° C. in a dry hydrogen for 5 hours.

Thereafter, (A) the steel sheet obtained by removing a forsterite layer or oxide layer from the steel sheet surface through pickling, and (B) the steel sheet obtained by rendering the surface after the pickling into a mirror finished state having a center-line average roughness of not more than 0.4 μm through a chemical polishing were subjected to CVD to obtain thin tension coats of TiN (thickness 0.6 μm) on the steel sheet surface.

A part of each of (A) and (B) was subjected to a coating treatment with a coating solution consisting of phosphate and colloidal silica.

The magnetic properties of the resulting products were compared with those of the conventionally manufactured product. The results are shown in the following Table 5.

TABLE 5(a)

| Steel components (wt %) | Annealing separator (1) composed mainly of MgO | Annealing separator (2) Al$_2$O$_3$, MgO, ZrO$_2$, TiO$_2$ | Surface treatment of steel sheet (A) pickling | Surface treatment of steel sheet (B) chemical polishing | Coating Phosphate and colloidal silica | Magnetic properties B$_{10}$(T) | Magnetic properties W$_{17/50}$ (W/kg) |
|---|---|---|---|---|---|---|---|
| Invention | | | | | | | |
| (a) C 0.043%, | o | | o | o | | 1.92 | 0.76 |
| Si 3.29%, | | o | o | o | | 1.93 | 0.72 |
| Mn 0.053%, | o | | o | | o | 1.91 | 0.73 |
| S 0.030%, | | o | o | | | 1.92 | 0.78 |
| B 0.0029%, | o | | o | | | 1.92 | 0.76 |
| Cu 0.25%, | | o | o | o | o | 1.92 | 0.74 |
| N 0.0076% | | | | | | | |
| Conventional product | o | | | | o | 1.89 | 0.94 |

TABLE 5(b)

| Steel components (wt %) | Annealing separator (1) composed mainly of MgO | Annealing separator (2) Al$_2$O$_3$, MgO, ZrO$_2$, TiO$_2$ | Surface treatment of steel sheet (A) pickling | Surface treatment of steel sheet (B) chemical polishing | Phosphate and colloidal silica | Magnetic properties B$_{10}$(T) | Magnetic properties W$_{17/50}$ (W/kg) |
|---|---|---|---|---|---|---|---|
| Invention | | | | | | | |
| (b) C 0.039%, | o | | o | o | | 1.94 | 0.73 |
| Si 3.39%, | | o | o | o | | 1.93 | 0.72 |
| Mn 0.062%, | o | | o | | o | 1.93 | 0.71 |
| S 0.028%, | | o | o | | | 1.92 | 0.77 |
| B 0.0036%, | o | | o | | | 1.93 | 0.76 |
| Cu 0.39%, | | o | o | o | o | 1.94 | 0.72 |
| N 0.0082% | | | | | | | |

TABLE 5(b)-continued

| | Treatment at each step | | | | | | |
|---|---|---|---|---|---|---|---|
| | Annealing separator | | Surface treatment of steel sheet | | Phosphate and colloi- | Magnetic properties | |
| Steel components (wt %) | (1) composed mainly of MgO | (2) Al$_2$O$_3$, MgO, ZrO$_2$, TiO$_2$ | (A) pickling | (B) chemical polishing | dal silica | B$_{10}$(T) | W$_{17/50}$ (W/kg) |
| Conventional product | o | | | | o | 1.89 | 0.96 |

TABLE 5(c)

| | Treatment at each step | | | | | | |
|---|---|---|---|---|---|---|---|
| | Annealing separator | | Surface treatment of steel sheet | | Coating Phosphate | Magnetic properties | |
| Steel components (wt %) | (1) composed mainly of MgO | (2) Al$_2$O$_3$, MgO, ZrO$_2$, TiO$_2$ | (A) pickling | (B) chemical polishing | and colloi- dal silica | B$_{10}$(T) | W$_{17/50}$ (W/kg) |
| Invention | | | | | | | |
| (c) C 0.038%, | o | | o | o | | 1.92 | 0.74 |
| Si 3.28%, | | o | o | | o | 1.93 | 0.73 |
| Mn 0.063%, | o | | o | | | 1.93 | 0.76 |
| S 0.027%, | | o | o | o | o | 1.93 | 0.72 |
| B 0.0028%, | | o | o | o | | 1.93 | 0.77 |
| N 0.0068% | | | | | | | |
| Conventional product | o | | | | o | 1.89 | 0.95 |

Example 5

(a) C: 0.044%, Si: 3.32%, Mn: 0.066%, Se: 0.019%, Mo: 0.022% and Sb: 0.028%

(b) C: 0.041%, Si: 3.35%, Mn: 0.063%, Se: 0.018%, Sb: 0.025%

A silicon steel slab of the above chemical composition was hot rolled to obtain a hot rolled steel sheet of 2.2 mm in thickness.

Then, the steel sheet was subjected to a cold rolling two times through an intermediate annealing at 950° C. to obtain a cold rolled steel sheet of 0.23 mm in final guage.

Thereafter, the steel sheet was subjected to decarburization and primary recrystallization annealing at 820° C. in a wet hydrogen, and coated with a slurry of an annealing separator composed of Al$_2$O$_3$ (70%), MgO (25%), ZrO$_2$ (3%) and TiO$_2$ (2%). The coated steel sheet was subjected to a secondary recrystallization annealing at 850° C. for 50 hours and further to a purification annealing at 1200° C. in a dry hydrogen for 8 hours.

Then, the steel sheets obtained by (A) removing the oxide from the steel sheet through pickling, (B) removing the oxide through grinding, (C) rendering the steel sheet surface after the pickling into a mirror finished state having a center-line average roughness of not more than 0.1 μm through a chemical polishing (D) rendering the steel sheet surface after the pickling into a mirror finished state having a center-line average roughness of not more than 0.1 μm through an electropolishing, (E) rendering the steel sheet surface after the pickling into a mirror finished state having a center-line average roughness of not more than 0.1 μm through a buffing, (F) rendering the steel sheet surface after the grinding into a mirror finished state having a center-line average roughness of not more than 0.1 μm through a chemical polishing were subjected to an ion plating to form TiN (thickness 0.8 μm) on the surface and further to a coating treatment, respectively.

The magnetic properties of the resulting products are shown in the following Table 6 together with those of the conventionally manufactured product.

TABLE 6(a)

| Steel components (wt %) | Treating method of steel sheet after final annealing | Magnetic properties | |
|---|---|---|---|
| | | B$_{10}$(T) | W$_{17/50}$(W/kg) |
| Invention | | | |
| (a) C 0.044%, | (a) Removing the oxide from the steel sheet through pickling. | 1.91 | 0.79 |
| Si 3.32%, | (b) Removing the oxide through grinding. | 1.91 | 0.78 |
| Mn 0.066%, | (c) Rendering the steel sheet surface after the pickling into a mirror finished state having a center-line average roughness of not more than 0.1 μm through a chemical polishing. | 1.92 | 0.71 |
| Se 0.019%, | | | |
| Mo 0.022%, | | | |
| Sb 0.028% | (d) Rendering the steel sheet surface after the pickling into a mirror finished state having a center-line average roughness of not more than 0.1 μm through an electropolishing. | 1.92 | 0.72 |
| | (e) Rendering the steel sheet surface after the pickling into a mirror finished state having a center-line average roughness of not more than 0.1 μm through a buffing. | 1.92 | 0.74 |
| | (f) Rendering the steel sheet surface after the grinding into a mirror finished state having a center-line average roughness of not more than 0.1 μm through a chemical polishing. | 1.92 | 0.74 |
| Conventional product | | 1.89 | 0.92 |

TABLE 6(b)

| Steel components (wt %) | Treating method of steel sheet after final annealing | Magnetic properties $B_{10}(T)$ | $W_{17/50}(W/kg)$ |
|---|---|---|---|
| Invention | | | |
| (a) C 0.041%, Si 3.35%, Mn 0.063%, Se 0.018%, Sb 0.025% | (a) Removing the oxide from the steel sheet through pickling. | 1.91 | 0.81 |
| | (b) Removing the oxide through grinding. | 1.91 | 0.79 |
| | (c) Rendering the steel sheet surface after the pickling into a mirror finished state having a center-line average roughness of not more than 0.1 μm through a chemical polishing. | 1.91 | 0.76 |
| | (d) Rendering the steel sheet surface after the pickling into a mirror finished state having a center-line average roughness of not more than 0.1 μm through an electropolishing. | 1.91 | 0.75 |
| | (e) Rendering the steel sheet surface after the pickling into a mirror finished state having a center-line average roughness of not more than 0.1 μm through a buffing. | 1.92 | 0.77 |
| | (f) Rendering the steel sheet surface after the grinding into a mirror finished state having a center-line average roughness of not more than 0.1 μm through a chemical polishing. | 1.89 | 0.93 |
| Conventional product | | 1.89 | 0.93 |

Example 6

A hot rolled sheet of silicon steel comprising 0.056% of C, 3.39% of Si, 0.068% of Mn, 0.018% of S, 0.025% of sol.Al and 0.0076% of N (thickness 1.8 mm) was subjected to a normalized annealing at 1050° C. for 3 minutes and then to a cold rolling two times through an intermediate annealing at 950° C. to obtain a cold rolled steel sheet of 0.23 mm in final gauge. Thereafter, the steel sheet was subjected to decarburization and primary recrystallization annealing at 820° C. for 3 minutes and coated with a slurry of an annealing separator composed of $Al_2O_3$ (60%), MgO (25%), $ZrO_2$ (10%) and $TiO_2$ (5).

Thereafter, secondary recrystallization annealing was carried out by raising temperature from 850° C. to 1050° C. at a rate of 8° C./hr. Subsequently, after purification annealing was carried out at 1200° C. in a dry hydrogen for 6 hours, oxides were removed from the surface through pickling, and the steel sheet surface was rendered into a mirror finished state by electropolishing. Then, various thin coats (about 0.6–0.7 μm in thickness) were formed through CVD (no mark in Table 7), ion plating ("o" in Table 7) and ion implantation ("Δ" in Table 7), and a coating consisting of phosphate and colloidal silica was formed thereon. The magnetic properties of the resulting products are shown in Table 7.

TABLE 7(a)

| Run No. | Kind of compound | Compound | | Magnetic properties $B_{10}(T)$ | $W_{17/50}(W/kg)$ |
|---|---|---|---|---|---|
| 1 | Nitride | TiN | o | 1.95 | 0.76 |
| 2 | | BN | | 1.96 | 0.72 |
| 3 | | $Si_3N_4$ | | 1.95 | 0.71 |
| 4 | | ZrN | | 1.94 | 0.70 |
| 5 | | AlN | | 1.94 | 0.76 |
| 6 | | $Cr_2N$ | o | 1.94 | 0.75 |
| 7 | | HfN | o | 1.94 | 0.74 |
| 8 | | NbN | o | 1.93 | 0.78 |
| 9 | | VN | o | 1.94 | 0.74 |
| 10 | | TaN | o | 1.93 | 0.76 |
| 11 | | $Mn_2N$ | | 1.93 | 0.77 |
| 12 | | NiN | | 1.93 | 0.78 |
| 13 | | $Mn_2N$ | | 1.93 | 0.78 |
| 14 | | $Mo_2N$ | | 1.93 | 0.77 |
| 15 | | $W_2N$ | | 1.93 | 0.79 |
| 16 | | $Co_2N$ | | 1.93 | 0.77 |

TABLE 7(b)

| Run No. | Kind of compound | Compound | | Magnetic properties $B_{10}(T)$ | $W_{17/50}(W/kg)$ |
|---|---|---|---|---|---|
| 17 | Carbide | Ti(CN) | Δ | 1.96 | 0.69 |
| 18 | | TiC | o | 1.95 | 0.71 |
| 19 | | SiC | o | 1.95 | 0.68 |
| 20 | | ZrC | | 1.95 | 0.71 |
| 21 | | WC | | 1.96 | 0.70 |
| 22 | | $Mo_2C$ | | 1.94 | 0.69 |
| 23 | | $Cr_7C_3$ | | 1.95 | 0.68 |
| 24 | | HfC | o | 1.94 | 0.69 |
| 25 | | VC | o | 1.94 | 0.68 |
| 26 | | NbC | | 1.94 | 0.73 |
| 27 | | TaC | | 1.93 | 0.76 |
| 28 | | NiC | o | 1.94 | 0.78 |

Example 7

A hot rolled steel sheet comprising 0.044% of C, 3.43% of Si, 0.063% of Mn, 0.025% of Se, 0.023% of Mo and 0.025% of Sb was subjected to a normalized annealing at 900° C. for 3 minutes and then to a cold rolling two times through an intermediate annealing at 950° C. to obtain a cold rolled steel sheet of 0.23 mm in final gauge.

After decarburization and primary recrystallization annealing was carried out at 820° C. in a wet hydrogen, the steel sheet was coated with an annealing separator composed of $Al_2O_3$ (70%), MgO (25%), ZnO (4%) and $TiO_2$ (1%), and subjected to a secondary recrystallization annealing at 850° C. for 50 hours and further to a purification annealing at 1180° C. in a dry hydrogen for 5 hours.

Subsequently, the surface of the steel sheet was lightly pickled to remove oxide layer therefrom and subjected to a chemical polishing with a mixed solution of 3% HF and $H_2O_2$ to render the surface into a mirror finished state.

Then, a thin tension coat of $Si_3N_4$, AlN, TiC, TiN, ZrN, HfN, $Cr_2N$, ZrC or Ti(CN) (0.8 μm in the thickness) was formed at a sample temperature of about 450° C. under a sample tensile load of 0.6 kg/mm² through ion plating, and then an insulation coating was formed thereon.

The magnetic properties, compressive stress dependence of magnetostriction (value of magnetostriction $\lambda_{pp}$ at compressive stress $\sigma$ of 0.4 kg/mm² or 0.6 kg/mm²) and lamination factor of the resulting products are shown in the following Table 8.

TABLE 8

| Kind of thin tension coat | Magnetic properties | | $\lambda_{pp} (\times 10^{-6})$ | | Lamination factor % |
|---|---|---|---|---|---|
| | $B_{10}(T)$ | $W_{17/50}$ (W/kg) | $\sigma$: 0.4 kg/mm² | $\sigma$: 0.6 kg/mm² | |
| (1) $Si_3N_4$ | 1.92 | 0.62 | 0.16 | 0.62 | 98 |
| (2) AlN | 1.92 | 0.63 | 0.19 | 0.63 | 98.5 |
| (3) TiC | 1.92 | 0.60 | 0.18 | 0.64 | 98 |
| (4) TiN | 1.92 | 0.62 | 0.21 | 0.63 | 98.5 |
| (5) ZrN | 1.92 | 0.65 | 0.17 | 0.66 | 98 |
| (6) HfN | 1.91 | 0.64 | 0.16 | 0.63 | 98 |
| (7) $Cr_2N$ | 1.91 | 0.63 | 0.14 | 0.71 | 98 |
| (8) ZrC | 1.92 | 0.64 | 0.16 | 0.72 | 98.5 |
| (9) Ti(CN) | 1.92 | 0.63 | 0.17 | 0.73 | 98.5 |

EXAMPLE 8

A silicon steel comprising 0.043% of C, 3.36% of Si, 0.067% of Mn, 0.021% of Se, 0.025% of Sb and 0.025% of Mo was heated at 1360° C. for 6 hours and hot rolled to obtain a hot rolled steel sheet of 2.2 mm in thickness. Then, the steel sheet was subjected to a normalized annealing at 900° C. for 3 minutes and further to a cold rolling two times through an intermediate annealing at 950° C. to obtain a cold rolled steel sheet of 0.23 mm in final gauge.

After decarburization and primary recrystallization annealing was carried out at 800° C. in a wet hydrogen, a slurry of an annealing separator composed of $Al_2O_3$ (60%), MgO (30%), ZnO (5%), $ZrO_2$ (2%) and $TiO_2$ (3%) was applied to the steel sheet surface. Thereafter, the coated steel sheet was subjected to a secondary recrystallization annealing at 850° C. for 50 hours and further to a purification annealing at 1200° C. in a dry $H_2$ for 5 hours.

After oxide was removed from the steel sheet surface, the surface was rendered into a mirror finished state having a center-line average roughness of 0.1 μm through electropolishing.

Then, a thin coat of TiN (thickness 0.8-1.0 μm) was formed on the steel sheet surface by various PVD processes {① magnetron sputtering process, ② EB+RF process, ③ HCD process, ④ multi-arc process, ⑤ ion implantation process}. In this case, the sample temperature in the formation of thin coat was 250° C., and the tensile tension of the sample was 0.6 kg/mm². Table 9 shows the magnetic properties of the products and X-ray analytical results of the thin coats.

For comparison, the magnetic properties of a product obtained by the conventional method, wherein the steel sheet after the decarburization and primary recrystallization annealing was coated with a slurry of an annealing separator composed mainly of MgO and then subjected to a secondary recrystallization annealing at 850° C. for 50 hours and further to a purification annealing at 1180° C. in a dry $H_2$ for 5 hours to form a forsterite layer on the steel sheet surface, are also shown in Table 9.

From Table 9, it is apparent that the magnetic properties are improved by each PVD described in the above ①-⑤, and also the good magnetic properties are obtained even when some amount of $Ti_2N$, Ti is contained in the TiN thin coat as apparent from the X-ray analysis of the thin coat.

TABLE 9

| Run No. | PVD process | Magnetic properties | | X-ray diffraction |
|---|---|---|---|---|
| | | $B_{10}(T)$ | 17/50(W/kg) | |
| 1 | Magnetron sputtering | 1.92 | 0.67 | TiN |
| 2 | EB + RF | 1.93 | 0.66 | TiN (main) Ti (very small) |
| 3 | HCD | 1.92 | 0.68 | TiN (main) $Ti_2N$ (small) Ti (very small) |
| 4 | Multi-arc | 1.92 | 0.69 | TiN (main) Ti (very small) |
| 5 | Ion implantation | 1.92 | 0.70 | TiN |
| 6 | Comparative product | 1.89 | 0.92 | forsterite |

EXAMPLE 9

A hot rolled steel sheet comprising 0.044% of C, 3.42% of Si, 0.068% of Mn, 0.025% of Mo, 0.024% of Se and 0.020% of Sb was subjected to a normalized annealing at 900° C. for 3 minutes and further to a cold rolling two times through an intermediate annealing at 950° C. to obtain a cold rolled steel sheet of 0.23 mm in final gauge.

After decarburization and primary recrystallization annealing was carried out at 820° C. in a wet hyrogen, the steel sheet was coated with an annealing separator composed of $Al_2O_3$ (80%) and MgO (20%) and then subjected to a secondary recrystallization annealing at 850° C. for 50 hours and further to a purification annealing at 1200° C. in a dry hydrogen for 8 hours.

After oxide layer was removed through pickling, a part of the sheet was rendered into a mirror finished state through a chemical polishing with a mixed solution of 3% HF and $H_2O_2$.

After TiN of 0.4 μm in thickness was formed by using an ion plating apparatus, AlN of 0.4 μm in thickness was formed thereon. Furthermore, a part of the sheet was provided at its surface with an insulation coating consisting of phosphate and colloidal silica. The magnetic properties of the resulting products are shown in the following Table 10 every the treating step.

TABLE 10

| Run No. | Treating conditions | Magnetic properties | |
|---|---|---|---|
| | | $B_{10}(T)$ | $W_{17/50}$ (W/kg) |
| i | Treatment of steel sheet: pickling Plating: AlN (0.4 μm) on TiN (0.4 μm) | 1.91 | 0.78 |
| ii | Treatment of steel sheet: pickling Plating: AlN (0.4 μm) on TiN (0.4 μm) Coating: phosphate and colloidal silica | 1.91 | 0.76 |
| iii | Treatment of steel sheet: chemical polishing after pickling Plating: AlN (0.4 μm) on TiN (0.4 μm) | 1.92 | 0.66 |
| iv | Treatment of steel sheet: chemical polishing after pickling Plating: AlN (0.4 μm) on TiN (0.4 μm) Coating: phosphate and colloidal silica | 1.92 | 0.65 |

EXAMPLE 10

A hot rolled steel sheet comprising 0.044% of C, 3.42% of Si, 0.068% of Mn, 0.025% of Mo, 0.024% of Se and 0.020% of Sb was subjected to a normalized annealing at 900° C. for 3 minutes and further to a cold rolling two times through an intermediate annealing at 950° C. to obtain a cold rolled steel sheet of 0.23 mm in final gauge.

After decarburization and primary recrystallization annealing was carried out at 820° C. in a wet hydrogen, the steel sheet was coated with an annealing separator composed of Al₂O₃ (80%) and MgO (20%) and then subjected to a secondary recrystallization annealing at 850° C. for 50 hours and further to a purification annealing at 1200° C. in a dry hydrogen for 8 hours.

After oxide layer was removed through pickling, a part of the sheet was rendered into a mirror finished state through a chemical polishing with a mixed solution of 3% HF and $H_2O_2$.

Then, a TiN thin coat of 0.4 μm in thickness was formed on the steel sheet surface while alternately defining a tension coat forming region of 18 mm in width and a coat non-forming region of 1 mm in width in a direction perpendicular to the rolling direction by annealing at 900° C. in a mixed gas atmosphere of $TiCl_4$ (60%), $N_2$ gas (25%) and $H_2$ gas (15%). Thereafter, a part of the sheet was provided on its surface with an insulation coating consisting of phosphate and colloidal silica.

The magnetic properties of the resulting products are shown in the following Table 11.

TABLE 11

| Run No. | Treating conditions | Magnetic properties $B_{10}(T)$ | $W_{17/50}$ (W/kg) |
|---|---|---|---|
| i | Treatment of steel sheet: pickling Plating: alternate formation of TiN of 20 mm in width and no TiN region of 1 mm in width | 1.91 | 0.77 |
| ii | Treatment of steel sheet: pickling Plating: alternate formation of TiN of 20 mm in width and no TiN region of 1 mm in width Coating: phosphate and colloidal silica | 1.91 | 0.75 |
| iii | Treatment of steel sheet: chemical polishing after pickling Plating: alternate formation of TiN of 20 mm in width and no TiN region of 1 mm in width | 1.92 | 0.69 |
| iv | Treatment of steel sheet: chemical polishing after pickling Plating: alternate formation of TiN of 20 mm width and no TiN region of 1 mm in width Coating: phosphate and colloidal silica | 1.92 | 0.67 |

EXAMPLE 11

A hot rolled steel sheet comprising 0.049% of C, 3.36% of Si, 0.078% of Mn, 0.026% of Al, 0.0025% of S, 0.1% of Cu and 0.12% of Sn was subjected to a normalized annealing at 1130° C. for 3 minutes, quenched and then subjected to a warm rolling at 300° C. to obtain a cold rolled steel sheet of 0.20 mm in final gauge.

After decarburization annealing was carried out at 850° C. in a wet hydrogen, the steel sheet was coated with an annealing separator composed of Al₂O₃ (80%), MgO (15%) and ZrO₂ (5%) and then subjected to a secondary recrystallization annealing by raising temperature from 850° C. to 1150° C. at a rate of 10° C./hr and further to a purification annealing at 1200° C. in a dry hydrogen for 8 hours.

After oxide layer was removed through pickling, the sheet surface was rendered into a mirror finished state through a chemical polishing with a mixed solution of 3% HF and $H_2O_2$, and a thin tension coat of BN, Si₃N₄, ZrN, AlN, TiC, SiC or ZrC (0.4–0.7 μm in thickness) was formed thereon by CVD process. Thereafter, irradiation was carried out by a pulse laser under the following conditions. An energy was $3 \times 10^{-3}$ J/m², a spot diameter was 0.2 mm, and a distance between the spot centers was 1.5 mm. Then, low temperature coating was performed at 550° C. The magnetic properties of the resulting products are shown in the following Table 12.

TABLE 12

| | Kind of thin tension coat | | Magnetic properties $B_{10}(T)$ | $W_{17/50}$(W/kg) |
|---|---|---|---|---|
| (1) | BN | (0.7 μm thickness) | 1.93 | 0.64 |
| (2) | Si₃N₄ | (0.6 μm thickness) | 1.93 | 0.63 |
| (3) | ZrN | (0.5 μm thickness) | 1.94 | 0.62 |
| (4) | AlN | (0.4 μm thickness) | 1.95 | 0.66 |
| (5) | TiC | (0.6 μm thickness) | 1.94 | 0.68 |
| (6) | SiC | (0.4 μm thickness) | 1.95 | 0.62 |
| (7) | ZrC | (0.7 μm thickness) | 1.94 | 0.65 |

EXAMPLE 12

(A) C: 0.041%, Si: 3.48%, Mn: 0.062%, Mo: 0.025%, Se: 0.022%, Sb: 0.025% and N: 0.0038%

(B) C: 0.053%, Si: 3.32%, Mn: 0.072%, S: 0.018%, Al: 0.025% and N: 0.0066%

(C) C: 0.039%, Si: 3.31%, Mn: 0.059%, S: 0.030%, B: 0.0019%, N: 0.0068% and Cu: 0.15%

(D) C: 0.046%, Si: 3.09%, Mn: 0.063%, Se: 0.019% and Sb 0.025%

(E) C: 0.038%, Si: 3.08%, Mn: 0.071%, S: 0.019%

Five hot rolled silicon steel sheets of the above compositions were used. At first, the hot rolled steel sheets (A), (C), (D), (E) were subjected to a normalized annealing at 900° C. On the other hand, the hot rolled steel sheet (B) was subjected to a normalized annealing at 1050° C. for 3 minutes and quenched from 900° C. Then, the steel sheets (A), (D), (E) were subjected to a cold rolling two times through an intermediate annealing at 950° C. to obtain cold rolled sheets of 0.23 mm in final gauge, while the steel sheets (B), (C) were subjected to a heavy cold rolling, during which a warm rolling at 300° C. was sandwiched, to obtain cold rolled sheets of 0.23 mm in final gauge.

Then, these cold rolled steel sheets were degreased, subjected to decarburization and primary recrystallization annealing at 830° C. in a wet hydrogen atmosphere having a dew point of 25° C., and coated with an annealing separator composed of Al₂O₃ (70%), MgO (25%) and ZrO₂ (5%).

Thereafter, the steel sheets (A), (D) were subjected to a secondary recrystallization annealing at 850° C. for 50 hours and further to a purification annealing at 1200° C. in a dry hydrogen for 6 hours, while the steel sheets (B), (C), (E) were subjected to a secondary recrystallization annealing by raising temperature from 850° C. to 1050° C. at a rate of 5° C./hr and further to a purification annealing at 1200° C. in a dry hydrogen for 8 hours.

The thus obtained steel sheets were pickled to remove oxide layer from their surfaces and subjected to a chemical polishing to render the surface into a mirror finished state having a center-line average roughness of 0.03 μm.

Then, a vapor deposited layer of Ti having a thickness of 0.7 μm was formed on the mirror finished surface.

Thereafter, the steel sheets (A), (B), (C) were annealed at 800° C. in H₂ gas atmosphere for 5 hours, and a part of them was further annealed at 700° C. in an atmosphere containing N₂ and/or CH₄ gas for 3 hours.

On the other hand, the steel sheets (D), (E) were immediately annealed at 800° C. in an atmosphere containing N₂ and/or CH₄ gas for 5 hours.

The C, N amounts in steel, magnetic properties and adhesion property of the thus obtained grain oriented silicon steel sheets provided with a thin coat of TiC, TiN or Ti(C,N) were measured to obtain results as shown in the following Table 13 together with C, N amounts in steel and magnetic properties after the final annealing.

Further, Table 13 shows the measured results on the magnetic properties of the product obtained by forming a coating consisting of phosphate and colloidal silica on the surface of the grain oriented silicon steel sheet provided with the thin coat.

TABLE 13(a)

| Steel symbol | After final annealing | | | | Final annealing → Mirror finishing → Ti deposition → Annealing | | | | | | Magnetic properties after the formation of the coating | |
|---|---|---|---|---|---|---|---|---|---|---|---|---|
| | Magnetic properties | | C, N in steel (ppm) | | | Magnetic properties | | C, N in steel (ppm) | | Adhesion* property | | |
| | $B_{10}(T)$ | $W_{17/50}$ (W/kg) | C | N | Atmosphere annealing | $B_{10}(T)$ | $W_{17/50}$ (W/kg) | C | N | (mm) | $B_{10}(T)$ | $W_{17/50}$ (W/kg) |
| (A) | 1.90 | 0.90 | 20 | 10 | annealing at 800° C. in H₂ gas for 5 hours | 1.92 | 0.79 | <10 | <7 | 25 | 1.92 | 0.79 |
| | 1.90 | 0.90 | 30 | 7 | annealing at 800° C. in H₂ gas for 5 hours and further at 700° C. in N₂ gas for 3 hours | 1.92 | 0.78 | <10 | <7 | 25 | 1.92 | 0.77 |
| | 1.90 | 0.90 | 20 | 13 | annealing at 800° C. in H₂ gas for 5 hours and further at 700° C. in N₂ + CH₄ + H₂ gas for 3 hours | 1.92 | 0.78 | <10 | <7 | 25 | 1.92 | 0.77 |
| | 1.90 | 0.92 | 25 | 42** | annealing at 800° C. in H₂ gas for 5 hours | 1.92 | 0.72 | <10 | <7 | 25 | 1.92 | 0.79 |
| | 1.90 | 0.93 | 45*** | 15 | annealing at 800° C. in H₂ gas for 5 hours and further at 700° C. in H₂ +CH₄ + Ar gas for 3 hours | 1.92 | 0.82 | <10 | <7 | 25 | 1.92 | 0.80 |

TABLE 13(b)

| Steel symbol | After final annealing | | | | Final annealing → Mirror finishing → Ti deposition → Annealing | | | | | | Magnetic properties after the formation of the coating | |
|---|---|---|---|---|---|---|---|---|---|---|---|---|
| | Magnetic properties | | C, N in steel (ppm) | | | Magnetic properties | | C, N in steel (ppm) | | Adhesion property | | |
| | $B_{10}(T)$ | $W_{17/50}$ (W/kg) | C | N | Atmosphere annealing | $B_{10}(T)$ | $W_{17/50}$ (W/kg) | C | N | (mm) | $B_{10}(T)$ | $W_{17/50}$ (W/kg) |
| (B) | 1.94 | 0.89 | 20 | 16 | annealing at 800° C. in H₂ gas for 5 hours | 1.94 | 0.78 | <10 | <7 | 25 | 1.94 | 0.77 |
| | 1.93 | 0.95 | 32 | 25 | annealing at 800° C. in H₂ gas for 5 hours and further at 700° C. in CH₄ gas for 3 hours | 1.94 | 0.81 | <10 | <7 | 25 | 1.94 | 0.80 |
| | 1.94 | 0.90 | 20 | 14 | annealing at 800° C. in H₂ gas for 5 hours and further at 700° C. in N₂ + Ar + H₂ gas for 3 hours | 1.95 | 0.79 | <10 | <7 | 25 | 1.94 | 0.78 |
| | 1.94 | 0.91 | 30 | 46** | annealing at 800° C. in H₂ gas for 5 hours | 1.94 | 0.77 | <10 | <7 | 25 | 1.94 | 0.77 |
| | 1.93 | 0.93 | 49*** | 23 | annealing at 800° C. in H₂ gas for 5 hours and further at 700° C. in CH₄ + N₂ gas for 3 hours | 1.93 | 0.80 | 12 | <7 | 25 | 1.94 | 0.81 |

TABLE 13(c)

| Steel symbol | After final annealing | | | | Final annealing → Mirror finishing → Ti deposition → Annealing | | | | | | Magnetic properties after the formation of the coating | |
|---|---|---|---|---|---|---|---|---|---|---|---|---|
| | Magnetic properties | | C, N in steel (ppm) | | | Magnetic properties | | C, N in steel (ppm) | | Adhesion property (mm) | | |
| | $B_{10}(T)$ | $W_{17/50}$ (W/kg) | C | N | Atmosphere annealing | $B_{10}(T)$ | $W_{17/50}$ (W/kg) | C | N | | $B_{10}(T)$ | $W_{17/50}$ (W/kg) |
| (C) | 1.93 | 0.94 | 20 | 19 | annealing at 800° C. in $H_2$ gas for 5 hours | 1.93 | 0.80 | <10 | <7 | 25 | 1.93 | 0.80 |
| | 1.92 | 0.96 | 30 | 32 | annealing at 800° C. in $H_2$ gas for 5 hours and further at 700° C. in $N_2$ and $CH_4$ mixed gas for 3 hours | 1.93 | 0.81 | <10 | <7 | 25 | 1.93 | 0.79 |
| (D) | 1.92 | 0.96 | 25 | 9 | annealing at 800° C. in $N_2$ gas for 5 hours | 1.92 | 0.86 | <10 | <7 | 25 | 1.91 | 0.85 |
| | 1.91 | 0.98 | 35 | 28 | annealing at 800° C. in $N_2CH_4$ mixed gas for 5 hours | 1.92 | 0.87 | <10 | <7 | 25 | 1.92 | 0.86 |
| (E) | 1.86 | 1.07 | 30 | 16 | annealing at 800° C. in $N_2$ gas for 5 hours | 1.89 | 0.91 | <10 | <7 | 25 | 1.89 | 0.91 |
| | 1.85 | 1.11 | 39 | 18 | annealing at 800° C. in $CH_4$ gas for 5 hours | 1.88 | 0.93 | <10 | <7 | 25 | 1.88 | 0.92 |

*Diameter causing no peeling at 180° bending
**Secondary recrystallization annealing in $N_2$ atmosphere
***Decarburization annealing in wet hydrogen with a dew point of 17° C.

EXAMPLE 13

A hot rolled sheet comprising 0.043% of C, 3.36% of Si, 0.063% of Mn, 0.026% of Mo, 0.021% of Se and 0.025% of Sb was subjected to a cold rolling two times through an intermediate annealing at 950° C. for 3 minutes to obtain a cold rolled steel sheet of 0.23 mm in final thickness. After decarburization and primary recrystallization annealing was carried out at 820° C. in a wet hydrogen atmosphere, the sheet was coated with an annealing separator composed of $Al_2O_3$ (70%), MgO (25%) and $ZrO_2$ (5%) and then subjected to a secondary recrystallization annealing at 850° C. for 50 hours and further to a purification annealing at 1200° C. in a dry hydrogen atmosphere for 7 hours.

After oxide layer was removed from the steel sheet surface through pickling, the surface was rendered into a mirror finished state having a center-line average roughness of not more than 0.04 μm through a chemical polishing, and then a metal or semi-metal as shown in the following Table 14 was deposited at a thickness of 0.7–0.8 μm thereon.

Subsequently, the sheet was annealed in an atmosphere containing $N_2$ or $CH_4$ to form a mixed thin coat of carbides and nitrides.

After a coating consisting of phosphate and colloidal silica was formed, the magnetic properties and adhesion property of the resulting products were measured to obtain results as shown in Table 14.

TABLE 14

| Run No. | Deposited metal · semi-metal | Kind of thin coat | Magnetic properties | | Adhesion property (mm) |
|---|---|---|---|---|---|
| | | | $B_{10}(T)$ | $W_{17/50}$ (W/kg) | |
| (1) | Cr | $Cr_2N$, $Cr_7C_3$ | 1.92 | 0.78 | 20 |
| (2) | Zr | ZrN, ZrC | 1.91 | 0.81 | 20 |
| (3) | Hf | HfC, HfN | 1.91 | 0.76 | 20 |
| (4) | V | VC, VN | 1.92 | 0.78 | 20 |
| (5) | Nb | NbC, NbN and the like | 1.91 | 0.77 | 20 |
| (6) | Ta | TaC, TaN and the like | 1.91 | 0.76 | 20 |
| (7) | Mn | $Mn_2N$, MnC | 1.91 | 0.75 | 20 |
| (8) | Mo | $Mo_2C$, $Mo_2N$ and the like | 1.92 | 0.74 | 20 |
| (9) | W | WC, $W_2N$ and the like | 1.92 | 0.76 | 20 |
| (10) | Co | $Co_2N$, $Co_2C$ and the like | 1.92 | 0.78 | 20 |
| (11) | Ni | $Ni_2N$, NiC and the like | 1.91 | 0.77 | 20 |
| (12) | Al | AlN, AlC | 1.92 | 0.73 | 20 |
| (13) | B | BN, BC | 1.91 | 0.76 | 20 |
| (14) | Si | SiC, $Si_3N_4$ | 1.92 | 0.77 | 20 |

We claim:

1. A method of producing an extra-low iron loss grain oriented silicon steel sheet, which comprises subjecting a silicon containing steel slab to a hot rolling, subjecting the resulting hot rolled steel sheet to one or two cold rollings with an intermediate annealing to form a cold rolled steel sheet having a given final gauge, subjecting the cold rolled steel sheet to decarburization and primary recrystallization annealing, applying an annealing separator onto the surface of the treated steel sheet, subjecting the coated steel sheet to a finish annealing and to secondary recrystallization annealing for developing secondary recrystallized grains in {110}<001> orientation and a purification annealing, removing the resulting oxide from the surface of the steel sheet, and forming on the sheet surface a thin coat of at least one layer composed mainly of at least one nitride and/or carbide of Ti, Zr, Hf, V, Nb, Ta, Mn, Cr, Mo, W, Co, Ni, Al, B and Si and strongly adhered to the surface of the silicon steel sheet through a mixed layer of the silicon steel sheet and the thin coat.

2. The method according to claim 1, wherein the thickness of said thin coat is controlled to a range of 0.005–5 μm.

3. The method according to claim 1, wherein said thin coat is formed by forming a vapor deposit layer of at least one element selected from Ti, Zr, Hf, V, Nb, Ta, Mn, Cr, Mo, W, Co, Ni, Al, B and Si and subjecting the vapor deposited layer to nitriding and/or carburizing treatment.

4. The method according to claim 1, wherein the formation of said thin coat is performed by CVD process.

5. The method according to claim 1, wherein the formation of said thin coat is performed by PVD process.

6. The method according to claim 1, wherein the formation of said thin coat is performed by section formation on the steel sheet surface.

7. The method according to claim 1, wherein the formation of said thin coat is performed by CVD process at a temperature of steel sheet of 450°–1100° C. under an elastic tension of not more than 2.0 kg/mm$^2$ to steel sheet.

8. The method according to claim 1, wherein the formation of said thin coat is performed by PVD process at a temperature of steel sheet of 100°–1100° C. under an elastic tension of not more than 2.0 kg/mm$^2$ to steel sheet.

9. The method according to claim 1, wherein an insulation layer is formed on said thin coat composed of nitride and/or carbide.

10. The method according to claim 1, wherein said annealing separator is composed mainly of MgO.

11. The method according to claim 1, wherein said annealing separator has a composition of which forms forsterite with oxides of Si and Fe at the steel sheet surface in the finish annealing.

12. The method according to claim 1, wherein the removal of oxide layer from the steel sheet surface after the finish annealing is performed by pickling or grinding.

13. The method according to claim 1, wherein the steel sheet surface after the removal of oxide layer is subjected to a finish polishing.

14. The method according to claim 1, wherein said finish polishing is a chemical or mechanical polishing.

15. The method according to claim 14, wherein said finish polishing provides a mirror state having a center-line average roughness Ra of not more than 0.4 μm.

16. The method according to claim 1, wherein said silicon containing steel slab is used to have a composition of 0.01–0.06 wt% of C, 2.0–4.0 wt% of Si, 0.01–0.20 wt% of Mn, 0.005–0.05 wt% in total of one or two of S and Se and the balance being substantially Fe.

17. The method according to claim 1, wherein said silicon containing steel slab is used to have a composition of 0.01–0.06 wt% of C, 2.0–4.0 wt% of Si, 0.01–0.20 wt% of Mn, 0.005–0.20 wt% of Sb, 0.005–0.05 wt% in total of one or two of S and Se and the balance being substantially Fe.

18. The method according to claim 1, wherein said silicon containing steel slab is used to have a composition of 0.01–0.06 wt% of C, 2.0–4.0 wt% of Si, 0.01–0.20 wt% of Mn, 0.005–0.20 wt% of Sb, 0.003–0.1 wt% of Mo, 0.005–0.05 wt% in total of one or two of S and Se and the balance being substantially Fe.

19. The method according to claim 1, wherein said silicon containing steel slab is used to have a composition of 0.01–0.06 wt% of C, 2.0–4.0 wt% of Si, 0.01–0.20 wt% of Mn, 0.005–0.06 wt% of Sol.Al, 0.001–0.01 wt% of N, 0.005–0.05 wt% in total of one or two of S and Se and the balance being substantially Fe.

20. The method according to claim 1, wherein said silicon containing steel slab is used to have a composition of 0.01–0.06 wt% of C, 2.0–4.0 wt% of Si, 0.01–0.20 wt% of Mn, 0.005–0.06 wt% of Sol.Al, 0.001–0.01 wt% of N, 0.005–0.1 wt % of Mo, 0.005–0.05 wt% in total of one or two of S and Se and the balance being substantially Fe.

21. The method according to claim 1, wherein said silicon containing steel slab is used to have a composition of 0.01–0.06 wt% of C, 2.0–4.0 wt% of Si, 0.01–0.20 wt% of Mn, 0.005–0.06 wt% of Sol.Al, 0.01–0.5 wt% of Sn, 0.01–1.0 wt% of Cu, 0.005–0.05 wt% in total of one or two of S and Se and the balance being substantially Fe.

22. The method according to claim 1, wherein said silicon containing steel slab is used to have a composition of 0.01–0.06 wt% of C, 2.0–4.0 wt% of Si, 0.01–0.2 wt% of Mn, 0.0003–0.02 wt% of B, 0.001–0.01 wt% of N, 0.005–0.05 wt% in total of one or two of S and Se and the balance being substantially Fe.

23. The method according to claim 1, wherein said silicon containing steel slab is used to have a composition of 0.01–0.06 wt% of C, 2.0–4.0 wt% of Si, 0.01–0.20 wt% of Mn, 0.0003–0.02 wt% of B, 0.001–0.01 wt% of N, 0.01–1.0 wt% of Cu, 0.005–0.05 wt% in total of one or two of S and Se and the balance being substantially Fe.

* * * * *

UNITED STATES PATENT AND TRADEMARK OFFICE
CERTIFICATE OF CORRECTION

PATENT NO. : 4,713,123

DATED : Dec. 15, 1987

INVENTOR(S) : Yukio Inokuti; Yoh Ito; Toshihiko Funashashi

It is certified that error appears in the above-identified patent and that said Letters Patent is hereby corrected as shown below:

Column 24, Table 6(b), second column of numbers, sixth number reads 0.93 should be 0.76.

Column 33, Claim 11, second line reads "annealing separator has a composition of which forms" should read "annealing separator has a composition which forms".

Column 33, Claim 14, first line reads "The method according to claim 1, wherein said" should read "The method according to claim 13, wherein said".

Signed and Sealed this

Nineteenth Day of September, 1989

Attest:

DONALD J. QUIGG

Attesting Officer

Commissioner of Patents and Trademarks